United States Patent
Orr et al.

(10) Patent No.: US 9,267,973 B2
(45) Date of Patent: Feb. 23, 2016

(54) POWER GENERATING COMPONENT CONNECTIVITY RESISTANCE

(71) Applicant: Solantro Semiconductor Corp., Ottawa (CA)

(72) Inventors: Raymond Kenneth Orr, Kanata (CA); Edward Keyes, Ottawa (CA)

(73) Assignee: Solantro Semiconductor Corp., Ottawa, Ontario (CA)

( * ) Notice: Subject to any disclaimer, the term of this patent is extended or adjusted under 35 U.S.C. 154(b) by 446 days.

(21) Appl. No.: 13/661,286

(22) Filed: Oct. 26, 2012

(65) Prior Publication Data

US 2014/0118014 A1    May 1, 2014

(51) Int. Cl.
   *G01R 27/02* (2006.01)
   *G01R 27/16* (2006.01)

(52) U.S. Cl.
   CPC ...................................... *G01R 27/16* (2013.01)

(58) Field of Classification Search
   None
   See application file for complete search history.

(56) References Cited

U.S. PATENT DOCUMENTS

| | | | |
|---|---|---|---|
| 2009/0080226 A1* | 3/2009 | Fornage | 363/74 |
| 2010/0198424 A1* | 8/2010 | Takehara et al. | 700/298 |
| 2011/0025130 A1* | 2/2011 | Hadar et al. | 307/80 |
| 2011/0037600 A1 | 2/2011 | Takehara et al. | |
| 2011/0068819 A1 | 3/2011 | Sims | |
| 2012/0182038 A1 | 7/2012 | Marzetta | |

FOREIGN PATENT DOCUMENTS

| | | |
|---|---|---|
| EP | 1703614 A2 | 9/2006 |
| WO | WO 2010/087804 A1 | 8/2010 |
| WO | WO 2011/117485 A1 | 9/2011 |
| WO | WO 2012/119258 A1 | 9/2012 |

OTHER PUBLICATIONS

European Search Report for EP13190146 dated Feb. 26, 2014.
Micro Inverters Voltage Rise Calculations, Direct Grid Technologies, LLC Downloaded from www.directgrid.com prior to Oct. 4, 2012.

* cited by examiner

*Primary Examiner* — Melissa Koval
*Assistant Examiner* — Courtney McDonnough
(74) *Attorney, Agent, or Firm* — Woodard Emhardt Moriarty McNett & Henry LLP

(57) ABSTRACT

Power generating component connectivity resistance monitoring techniques are disclosed. In an array of power generating components that are connected in parallel to a power bus, a power generating component measures an output current that it supplies to the power bus. Respective first and second power generating components measure a first voltage at an output of the first power generating component and a second voltage at an output of the second power generating component. A resistance in the array between first and second connection points in the array through which the output current flows is determined based on the measurements of the output current, the first voltage, and the second voltage.

30 Claims, 14 Drawing Sheets

POWER GENERATING COMPONENT CONNECTIVITY RESISTANCE

FIELD OF THE INVENTION

This invention relates generally to arrays of power generating components such as photovoltaic solar panels and in particular to monitoring array connection quality.

BACKGROUND

PhotoVoltaic (PV) solar panels are becoming an important source of electrical power. Large, megawatt arrays with panels numbering in the tens of thousands are increasingly common. BIPV (Building Integrated PhotoVoltaic) power generation in which the panels are integral to a building itself (e.g. roofing tiles) is also becoming popular. A typical PV panel array is organized into many small groups of panels (typically tens of panels in a group) connected to a local power bus. These local buses connect to a main power bus.

PV panels are necessarily exposed to the outside weather and have a typical service lifetime requirement of tens of years. Over this lifetime an individual panel's connection to the power bus may be subject to corrosion from moisture ingress, mechanical stress from wind or snow loads, thermal cycling and other environmental factors, resulting in a deterioration of the connection quality and high connection resistance. The local power bus is also subject to similar stress and problems. Increased connection resistance can lead to undesirable lost power, overheating or fire.

Manual monitoring of the quality of the array's power connections is undesirable since it would be time consuming and require the creation of special test points for access. BIPV panels pose additional problems since they may not be at ground level and their cabling runs can be hidden between the panel and the building and therefore difficult to access and inspect.

SUMMARY

It could be advantageous to be able to monitor the health of a PV panel array's connections in situ, to identify connection issues before they develop into serious problems. It could also be advantageous to be able to precisely locate a failing or failed connection, especially in a large panel array which might contain thousands of panels. Precise identification of a fault location is particularly important for BIPV panels, for instance, to minimize any disruption of the building's structural components such as a roof or building facade. This monitoring and fault location capability could use existing measurement functionality of the PV array and not require additional hardware or significantly increase costs.

According to one aspect of the invention, a method for determining electrical resistances in an array of power generating components connected in parallel to a power bus is provided. The method involves measurement, by a power generating component, of an output current supplied to the power bus by the power generating component; measurement, by respective first and second power generating components, of a first voltage at an output of the first power generating component and a second voltage at an output of the second power generating component; and determination of a resistance in the array between first and second connection points in the array through which the output current flows, based on the measurements of the output current, the first voltage, and the second voltage.

At least one of the first and second connection points could be displaced from but at substantially the same voltage as the output of the first power generating component or the output of the second power generating component in the array. Thus, the measured voltages could be voltages that are measured at the connection points between which resistance is to be determined, voltages that are measured at "equipotential" points that are different from the connection points but at substantially the same voltage as the connection points, or some combination of voltages measured at one or more connection points and voltages measure at one or more substantially equipotential points.

In some embodiments, measurement of both the output current and the first voltage is by the first power generating component, and the second power generating component is adjacent to the first power generating component in the array and is in an inactive mode not outputting current to the power bus.

The second power generating component could be upstream from the first power generating component relative to a direction of power flow from the array to a load, in which case the resistance could be a resistance between the first power generating component and the power bus. The method might then further include measurement, by a third power generating component that is in an inactive mode and is not outputting current to the power bus and is adjacent to and downstream from the first power generating component relative to the direction of power flow from the array to a load, of a third voltage at an output of the third power generating component. The determination of the resistance would then involve determination of a second resistance between the second connection point and a third connection point in the array through which the output current flows, based on the measurements of the output current, the second voltage, and the third voltage.

If the second power generating component is downstream from the first power generating component relative to a direction of power flow from the array to a load, then the resistance could be a combination of a resistance between the power generating device and the power bus and a resistance between connection points at which the first and second power generating components are connected to the power bus.

The first power generating component could be downstream from the power generating component that measures the output current and the second power generating component could be downstream from the first power generating component relative to a direction of power flow from the array to the load, with the first and second power generating components in the inactive mode not outputting current to the power bus. The resistance would then be a resistance between connection point at which the first and second power generating components are connected to the power bus.

In some embodiments, the measurement of an output current involves measurement, by each of the power generating components, of a respective output current supplied to the power bus by each of the power generating components; measurement of a first voltage and a second voltage comprises measurement, by each of the power generating components, of a respective voltage at a respective output of each of the power generating components; and the determination of a resistance comprises determination of a respective resistance between adjacent connection points at which said power generating components are connected to the power bus.

In some embodiments, the measurement of an output current involves measurement, by each of multiple power generating components, of respective output currents supplied to the power bus by each of the multiple power generating components; measurement of a first voltage and a second voltage involves measurement, by pairs of power generating components that are in an inactive mode and not outputting current to the power bus, of respective voltages at outputs of the power generating components of each pair; and determination of a resistance involves determination of respective resistances between adjacent connection points at which said pairs of power generating components are connected to the power bus.

The power generating components may include photovoltaic devices in some embodiments.

The measurements could be performed by a DC to AC inverter of each power generating component.

The method could also involve communication of the measurements to an array monitor for the determination of the resistance and, in some embodiments, control of the second power generating component by the array monitor to place the second power generating component into the inactive mode.

The current and voltage measurements could be performed sequentially at multiple locations in the array to determine resistances associated with multiple power generating components.

In some embodiments, the current and voltage measurements are performed at regularly scheduled time intervals.

The method could include generation of a fault signal responsive to any of the resistances exceeding a threshold value.

According to another aspect of the invention, a power generation system includes: an array of a plurality of power generating components connected in parallel to a power bus; and an array monitor, with the power generating components including a power generating component that measures an output current supplied to the power bus by said power generating component, and respective first and second power generating components that measure a first voltage at an output of the first power generating component and a second voltage at an output of the second power generating component. The array monitor determines a resistance in the array between first and second connection points in the array through which the output current flows based on the measurements of the output current, the first voltage, and the second voltage.

The first power generating component measures the output current and the first voltage, and the second power generating component is adjacent to the first power generating component in the array and is controlled by the array monitor to be in an inactive mode not outputting current to the power BUS, in some embodiments.

The second power generating component could be upstream from the first power generating component relative to a direction of power flow from the array to a load, in which case the resistance could be a resistance between the first power generating component and the power bus.

In some embodiments, the power generating components also include a third power generating component, that is controlled by the array monitor to be in an inactive mode not outputting current to the power bus and is adjacent to and downstream from the first power generating component relative to the direction of power flow from the array to a load, and that measures a third voltage at an output of the third power generating component. The array monitor could then determine a second resistance between the second connection point and a third connection point in the array through which the output current flows, based on the measurements of the output current, the second voltage, and the third voltage.

Where the second power generating component is downstream from the first power generating component relative to a direction of power flow from the array to a load, the resistance could be a combination of a resistance between the power generating component and the power bus and a resistance between connection points at which the first and second power generating components are connected to the power bus.

At least one of: the array monitor and a power generating component generates a fault signal responsive to said resistance exceeding a threshold value in some embodiments.

A method for determining electrical resistances in an array of power generating components connected in parallel to a power bus, according to yet another aspect of the invention, involves: control of a power generating component to measure an output current supplied to the power bus by said power generating component; control of respective first and second power generating components to measure a first voltage at an output of the first power generating component and a second voltage at an output of the second power generating component; and determination of a resistance in the array between first and second connection points in the array through which the output current flows, based on the measurements of the output current, the first voltage, and the second voltage.

The determination of a resistance could involve receipt of the output current, the first voltage, and the second voltage from the power generating component that measures the output current and the respective first and second power generating components that measure the first voltage and the second voltage.

In some embodiments, the first power generating component is controlled to measure both the output current and the first voltage, the second power generating component is adjacent to the first power generating component in the array, and the method includes control of the second power generating component to be in an inactive mode not outputting current to the power bus while the second voltage is measured.

The second power generating component could be upstream from the first power generating component relative to a direction of power flow from the array to a load, in which case the resistance could be a resistance between the first power generating component and the power bus.

The method could also include control of a third power generating component, that is adjacent to and downstream from the first power generating component relative to the direction of power flow from the array to a load, to be in an inactive mode not outputting current to the power bus and to measure a third voltage at an output of the third power generating component. The determination of the resistance could then also involve determination of a second resistance between the second connection point and a third connection point in the array through which the output current flows, based on the measurements of the output current, the second voltage, and the third voltage.

Where the second power generating component is downstream from the first power generating component relative to a direction of power flow from the array to a load, the resistance could be a combination of a resistance between the power generating component and the power bus and a resistance between connection points at which the first and second power generating components are connected to the power bus.

The control of a power generating component to measure an output current could involve control of each of the power generating components to measure a respective output current supplied to the power bus by each of the power generating components. The control of the respective first and second power generating components to measure the first voltage and the second voltage could involve control of each of the power generating components to measure a respective voltage at a respective output of each of the power generating components. The determination of a resistance could then involve determination of respective resistances between pairs of adjacent connection points at which the power generating components are connected to the power bus.

According to a further aspect of the invention, an apparatus includes: an interface that enables communication with power generating components in an array in which said power generating components are connected in parallel to a power bus; and a connectivity resistance monitor, operatively coupled to the interface, to control a power generating component to measure an output current supplied to the power bus by the power generating component; to control respective first and second power generating components to measure a first voltage at an output of the first power generating component and a second voltage at an output of the second power generating component; and to determine a resistance in the array between first and second connection points in the array through which the output current flows, based on the measurements of the output current, the first voltage, and the second voltage.

DETAILED DESCRIPTION

A PV panel converts solar energy into electricity via the photoelectric effect. Currently available panel technology is typically capable of generating in the low hundreds of watts of electrical power per panel in full sunlight. Groups of panels are typically connected to a local power bus which collects their power and feeds it into a main power bus.

Traditional PV power systems use a DC local power bus with panels connected in series. The local power bus voltage depends on the voltage output of each individual panel and the number of panels connected to the bus. With a typical PV panel DC output voltage of 36 volts in full sunlight, the DC bus voltage can be hundreds of volts. The DC local power bus is connected to a power inverter which converts the DC voltage to grid compatible AC power. The DC output voltage of a PV panel will vary with the amount of insolation that it receives. Thus the local power bus voltage, which is the sum of the individual PV panel voltages in a DC PV panel system, also varies with insolation received. In this type of arrangement there is no easy way to monitor the quality of the connection of the PV panels to the local power bus since the PV panels possess no measurement functionality.

With more recently developed micro-inverter technology each PV panel is equipped with its own inverter and the local power bus is an AC bus. Micro-inverters typically include a DC to DC converter to first convert the variable PV panel output voltage to a relatively constant DC value which is then converted to AC. Micro-inverters can be single-phase designs, in which a single-phase AC voltage is output, or multi phase designs. A common multi-phase design is three phase in which three AC output voltages of equal amplitude and separated in phase by 120 degrees are produced.

Figure 1:
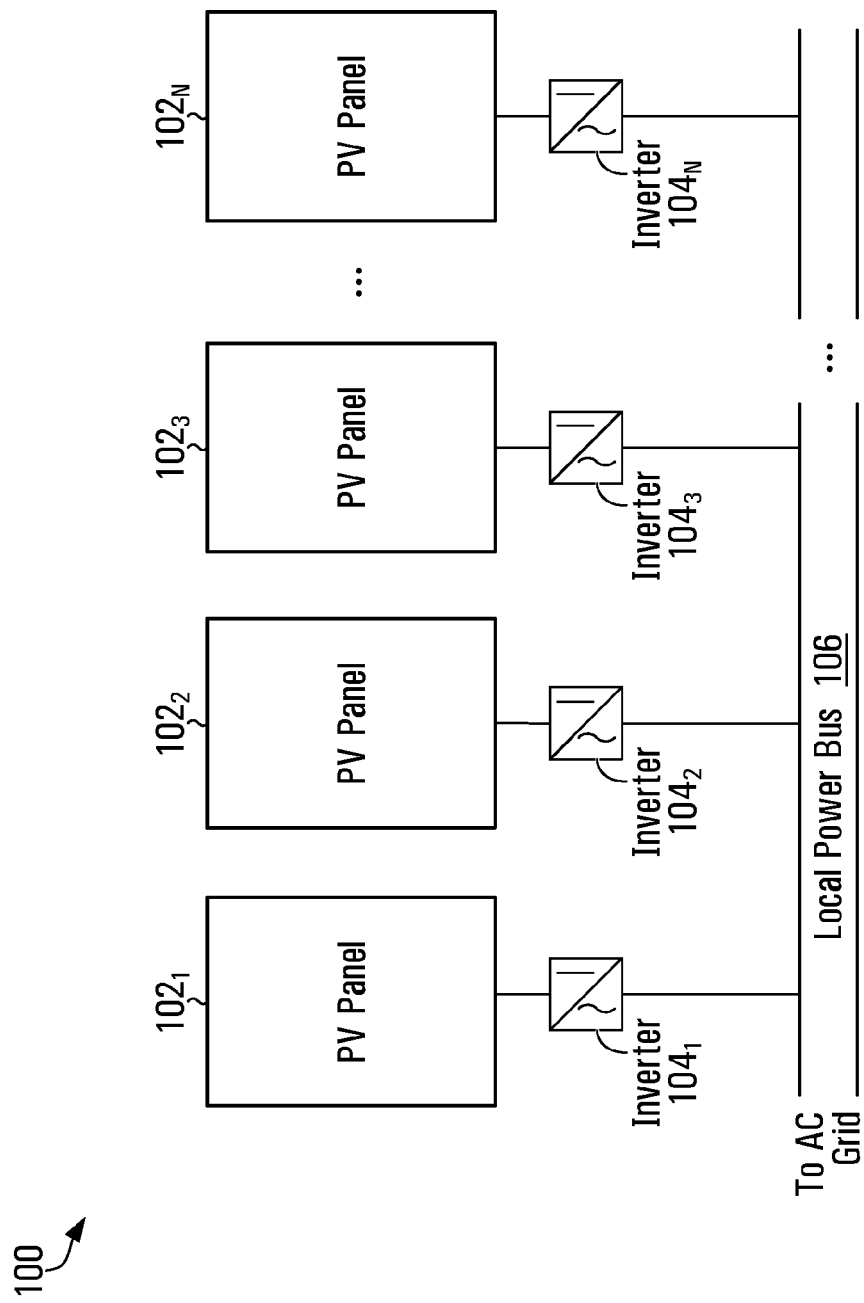
FIG. 1 is a block diagram illustrating an example PV panel array with micro-inverters.

FIG. 1 is a block diagram illustrating an example PV panel array with micro-inverters, and represents a typical arrangement of panels and micro-inverters. In the example array 100 of FIG. 1, there are N PV panels $102_1, \ldots, 102_N$, each connected to a local power bus 106 through a respective inverter $104_1, \ldots, 104_N$. For simplicity the inverter to local power bus connection is shown as a single line and a single connection. However, it should be understood that the number of physical wires and connections is dependent on the type of inverter output. A single-phase inverter will have at least two physical wires, for power and neutral, and a further ground wire could also be provided. A three-phase inverter will have at least three physical wires corresponding to the three line voltages and frequently will have a fourth wire for neutral.

The combination of a PV panel and associated elements, such as a micro-inverter and possibly one or more other elements, represents an example of a power generating component. In one embodiment, a power generating component is controllable as disclosed herein, and includes not only a power generator such as a PV panel that actually generates power, but other elements as well. A micro-inverter could be provided in a housing that is integrated into a PV panel in one possible implementation of a power generating component, for example.

Figure 2:
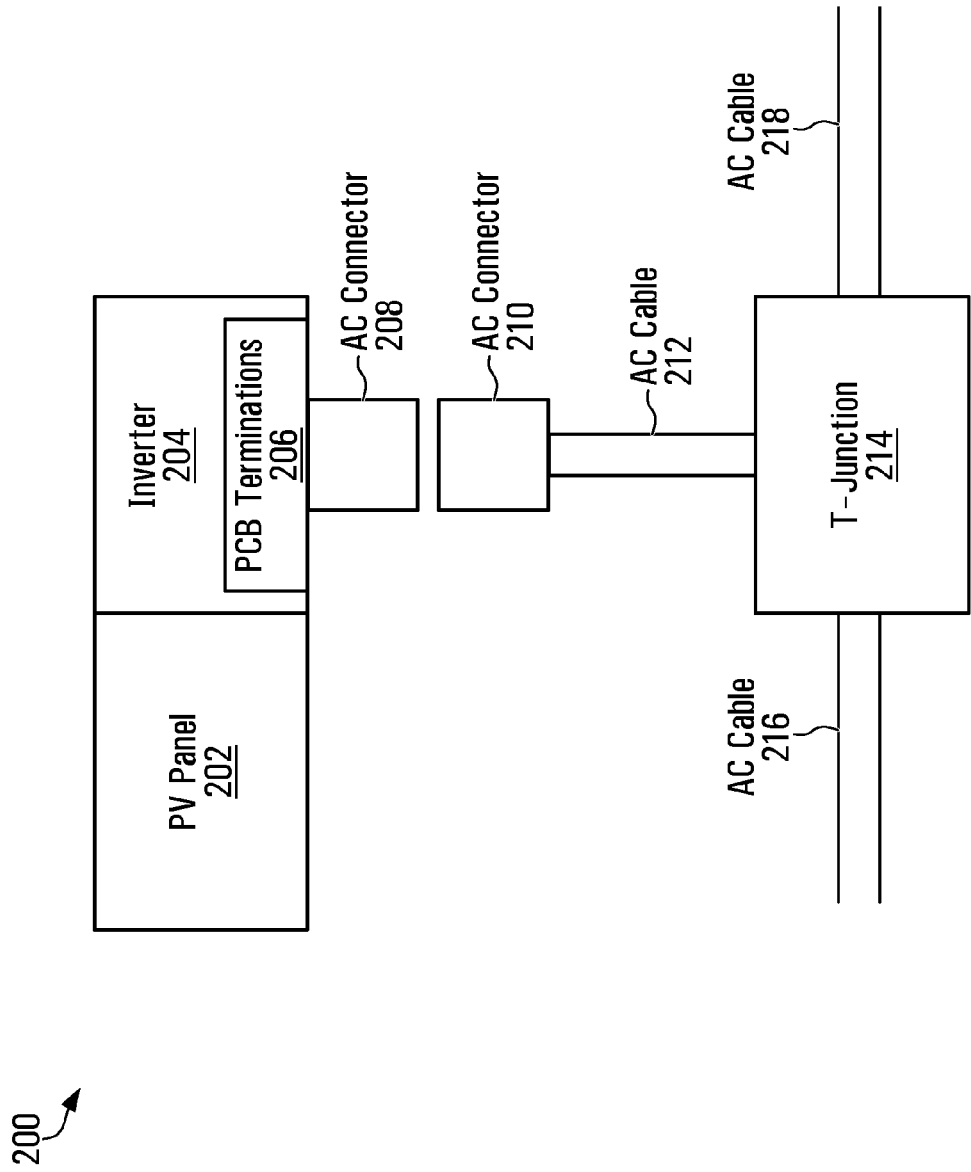
FIG. 2 is a block diagram illustrating an example of an inverter to local power bus connection.

FIG. 2 is a block diagram illustrating an example of an inverter to local power bus connection. In this example system 200, only one PV panel 202 and inverter 204 are shown, although multiple PV panels could be connected to the same AC local power bus in the same manner. The local power bus in this example includes an AC cable with segments 216, 218 interconnected by a T-junction 214. Although only one T-junction is shown in FIG. 2, such T-junctions could be provided at periodic substantially equidistant spacings from each other along the local power bus in some embodiments. Each T-junction 214 connects to an inverter 204 via a secondary cable run 212 and mating AC connectors 208, 210. The AC connector 208 could be mounted to a housing of the inverter 204, and be operatively coupled to Printed Circuit Board (PCB) terminations 206 on a PCB that carries at least part of the inverter in some embodiments.

Figure 3:
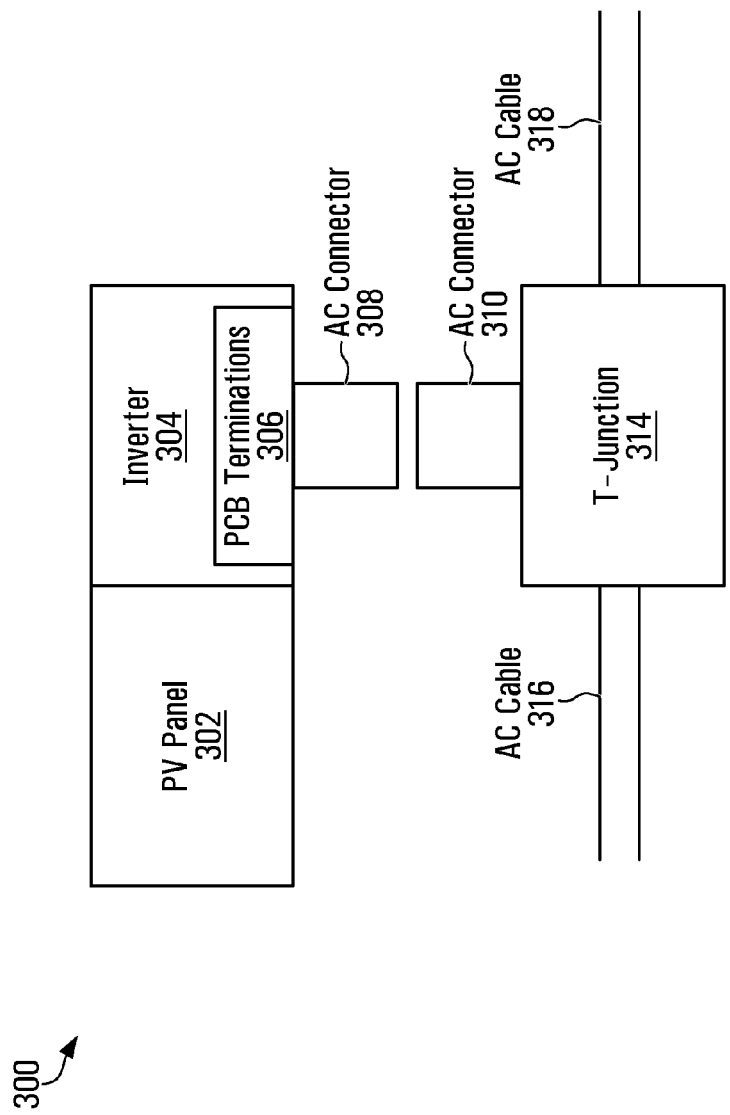
FIG. 3 is a block diagram illustrating an example of an alternate inverter to local power bus connection.

FIG. 3 is a block diagram illustrating an example of an alternate inverter to local power bus connection. In the example arrangement 300, the secondary cable run 212 (FIG. 2) is eliminated and the AC connector 310 at the T-junction 314 plugs into the inverter 304 via the AC connector 308, which is mounted to the housing of the inverter in one embodiment. The impedance between the inverter 304 and the local power bus in this example arrangement 300 is necessarily lower than in the example system 200 (FIG. 2), as a result of eliminating the secondary cable run 212. The other components 302, 306, 316, 318 are substantially the same as similarly labelled components in FIG. 2.

Figure 4:
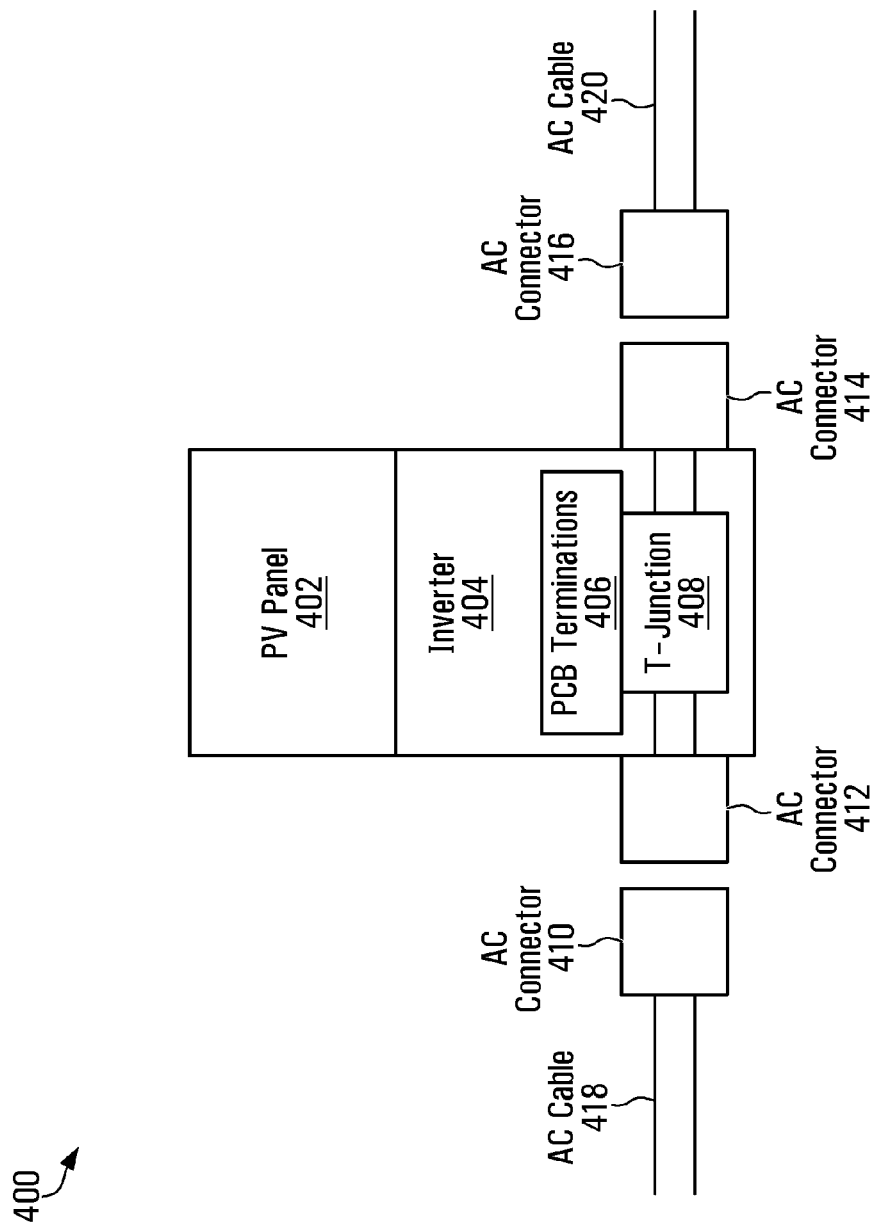
FIG. 4 is a block diagram illustrating an example of a double connector inverter to local power bus connection.

FIG. 4 is a block diagram illustrating an example of a double connector inverter to local power bus connection, and represents yet another possible connector arrangement 400. The local power bus AC cable segments 418, 420 connect directly to the housing of the inverter 404 via mating AC connectors 410/412, 414/416. The T-junction 408 is contained within a housing of the inverter 404 in the example shown. This arrangement 400 also eliminates the secondary cable run 212 (FIG. 2) but has twice as many AC connectors 410, 412, 414, 416 as the arrangement 300 (FIG. 3). The other components 402, 406 are substantially the same as similarly labelled components in FIGS. 2 and 3.

Figure 5:
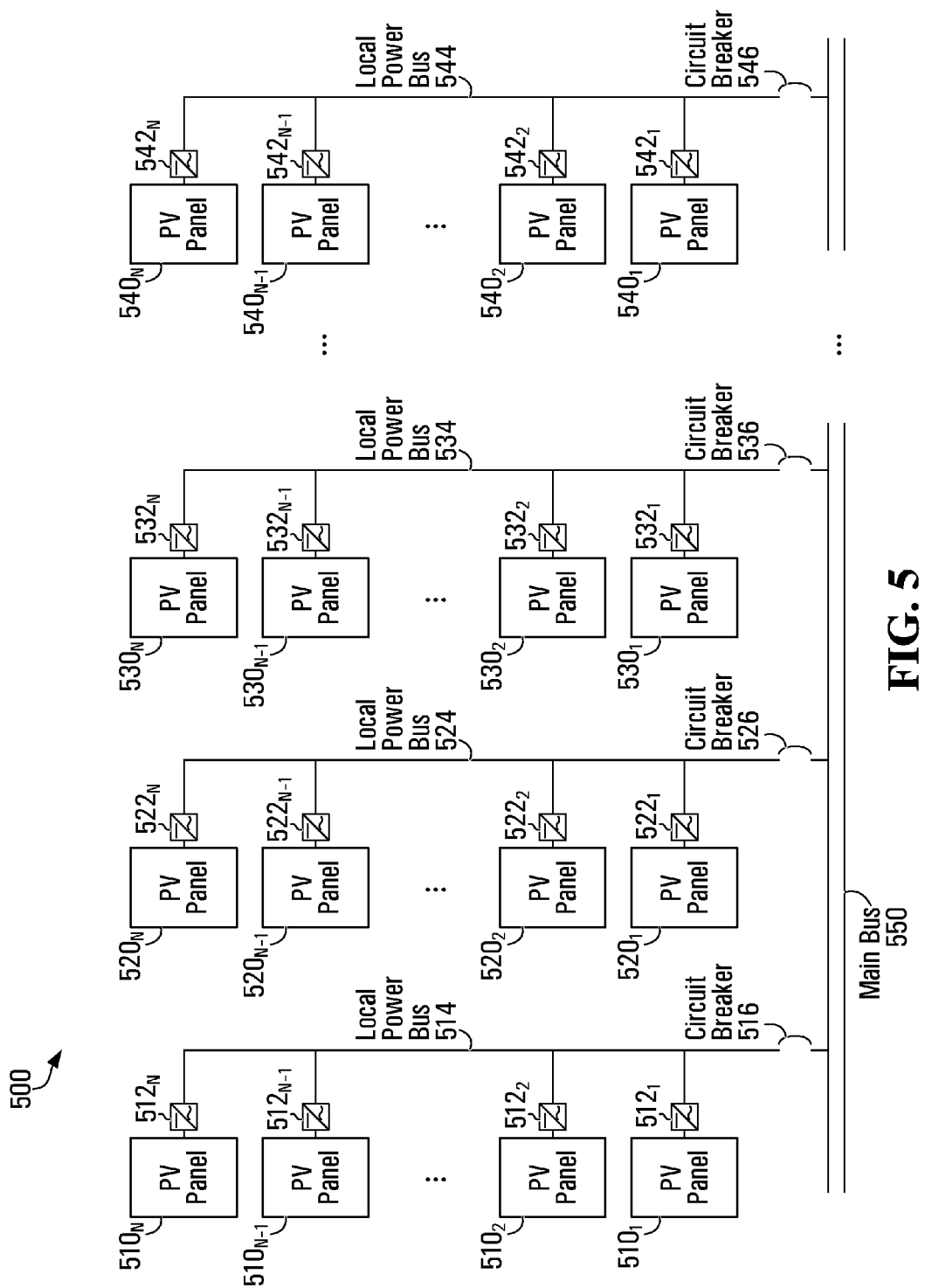
FIG. 5 is a block diagram illustrating an example PV panel array and bussing.

FIG. 5 is a block diagram illustrating an example PV panel array and bussing, and includes a large group of PV panels. In the example array 500, groups of "N" PV panels 510, 520, 530, 540, with respective inverters 512, 522, 532, 542 are connected in parallel to AC local power buses 514, 524, 534, 544. The local power buses 514, 524, 534, 544 are connected to a main AC bus 550 through circuit breakers 516, 526, 536, 546. In addition to providing overcurrent protection, the circuit breakers 516, 526, 536, 546 could be used for other purposes, such as manual isolation of the local power buses 514, 524, 534, 544 and/or automatic isolation of the local power buses on loss of AC grid voltage. In other embodiments, separate switches could be used for these types of manual and/or automatic isolation of the local power buses 514, 524, 534, 544 from the main AC bus 550.

The main AC bus 550 is connected to the AC grid in the case of a grid tied PV installation. For small panel arrays there might be no main AC bus 550 and the local power bus or buses 514, 524, 534, 544 might connect directly to the grid. The number of PV panels 510, 520, 530, 540 on a local power bus 514, 524, 534, 544 is a function of the output power of each PV panel, the output voltage of each inverter 512, 522, 532 542, and the maximum current rating of the local power bus 514, 524, 534, 544. For 100 W panels, inverters with a 240 V AC output voltage and a 15 A bus, "N" will typically be less than thirty.

It should be appreciated that the example array 500 is intended solely for illustrative purposes. Another possible PV panel array and bussing configuration is to have the connection to the main AC bus 550 at the midpoint of the AC local power buses 514, 524, 534, 544. This has the advantage of reducing the maximum cable or bus resistance seen by the most remote inverters $512_N$, $522_N$, $532_N$, $542_N$.

Figure 6:
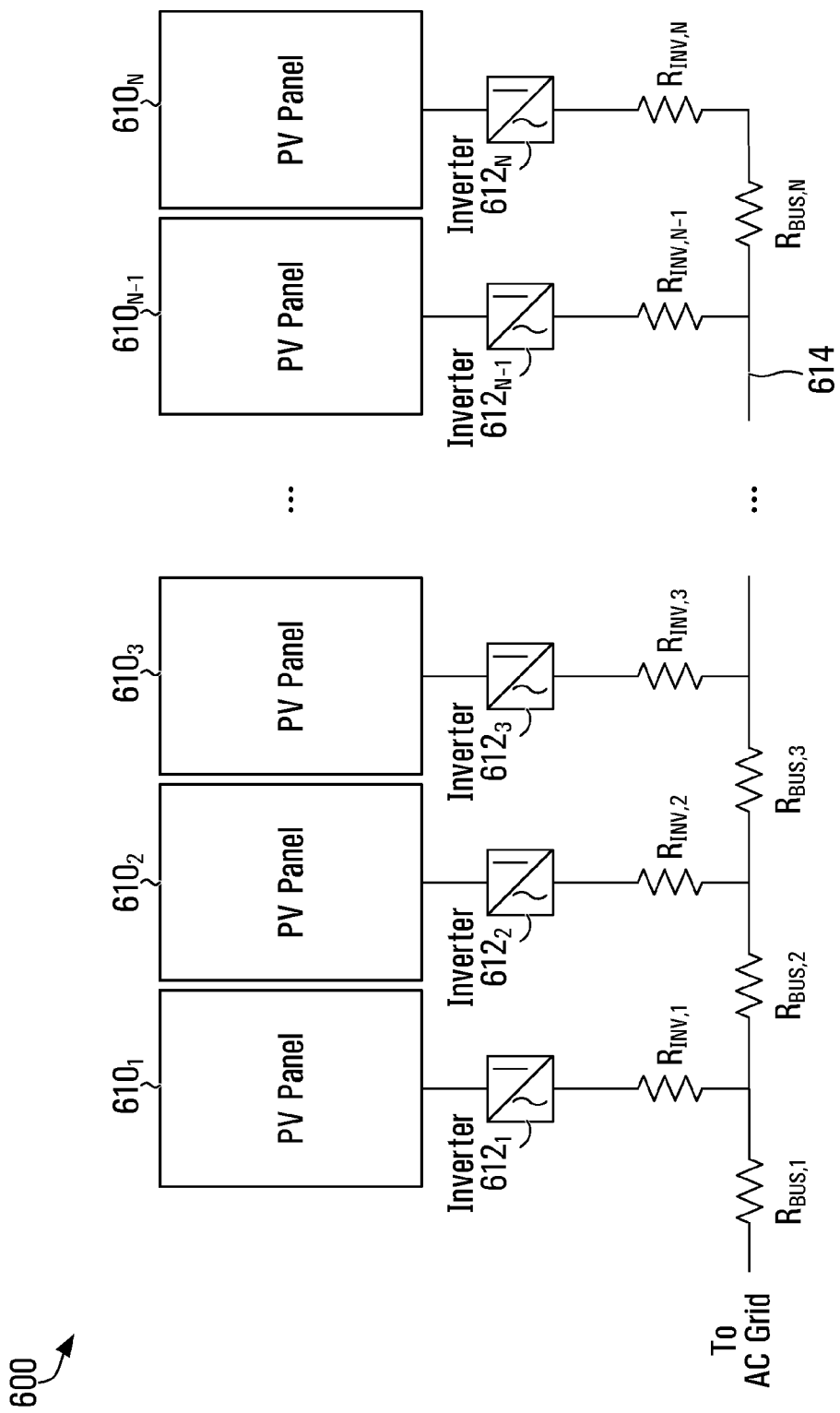
FIG. 6 is a block diagram illustrating an example of a PV array resistance network.

FIG. 6 is a block diagram illustrating an example of a PV array resistance network 600, and shows the resistances that might be of interest in monitoring connectivity in a PV panel array. The example network 600 includes N PV panels 610 and N inverters 612. The resistance between an i-th inverter 612 and the local power bus 614 is denoted $R_{INV,\ i}$. The resistance of the cabling and connectors between inverters i and i−1 is denoted $R_{BUS,\ i}$. As in FIG. 1, the inverter to bus connection in FIG. 6 is shown as a single line and a single connection for simplicity. The number of physical wires and connections would be dependent on the type of the inverters 612.

The resistances shown in FIG. 6, and in other drawings, represent connector and cable resistances. Such resistances are undesirable but unavoidable due to non-zero resistance of any conductor or connector. This type of resistance is often referred to as parasitic resistance. Bus and inverter resistances are also referred to herein as connection or connectivity resistance. It should be appreciated that a connection or connectivity resistance could be a bus resistance, an inverter resistance, or in some cases a sum of multiple resistances. Connection or connectivity resistance is not intended to be limited to denoting the resistance of a connector such as a blade connector, spade connector ring connector or any other specific type of connector component. For example, it is not intended to exclude the resistance contributed by the length of wiring in a cable between two connection points.

A single-phase inverter will connect to the local power bus 614 through at least two physical wires for power. An additional wire for ground could also be provided in some embodiments. In a lumped model as shown in FIG. 6, the resistance $R_{INV,i}$ is thus the series summation of the two resistances in these at least two physical wires. The physical wires will likely be part of a single cable and connector combination in many implementations, and this cable and connector combination would normally be replaced in the event of a high resistance connection. Therefore, the exact physical location of the high resistance in a cable will be irrelevant from a maintenance perspective in many implementations, and thus only the series resistance $R_{INV,i}$ might be monitored in some embodiments.

Similarly, the AC local power bus 614 in FIG. 6 is shown as a single line for simplicity while in the case of single-phase inverters 612 it will actually include at least two physical wires. The bus resistance $R_{BUS,i}$ is thus the series summation of resistances in those physical wire lengths. Again, the physical wires will likely be part of a single cable and connector combination in many implementations and this cable and connector combination would normally be replaced in the event of a high resistance connection. Therefore, the exact location of the high resistance in the cable is again irrelevant from a maintenance perspective and only the series resistance $R_{BUS,i}$ might be monitored.

In an embodiment, the inverters in FIGS. 1 to 6 are microinverters that are mounted to and carried by PV panels, and have the ability to measure their current and voltage outputs so that controllable amounts of current can be supplied to the local power bus. Inverters could also incorporate communication abilities which allows them to communicate with a remote array monitor to receive commands and report back measurements, for example. Communication can be either wireless or wired. Some currently available microinverters incorporate voltage and current measurement as well as communication abilities. These capabilities have historically been used to monitor power and report on problems with a microinverter itself. According to the present disclosure however, these capabilities are usefully employed to monitor, diagnose and communicate issues with the microinverter connection network. These capabilities are employed to determine the resistances $R_{BUS,i}$ of the local power bus and the resistances $R_{INV,i}$ between the inverters and the local power bus.

Figure 7:
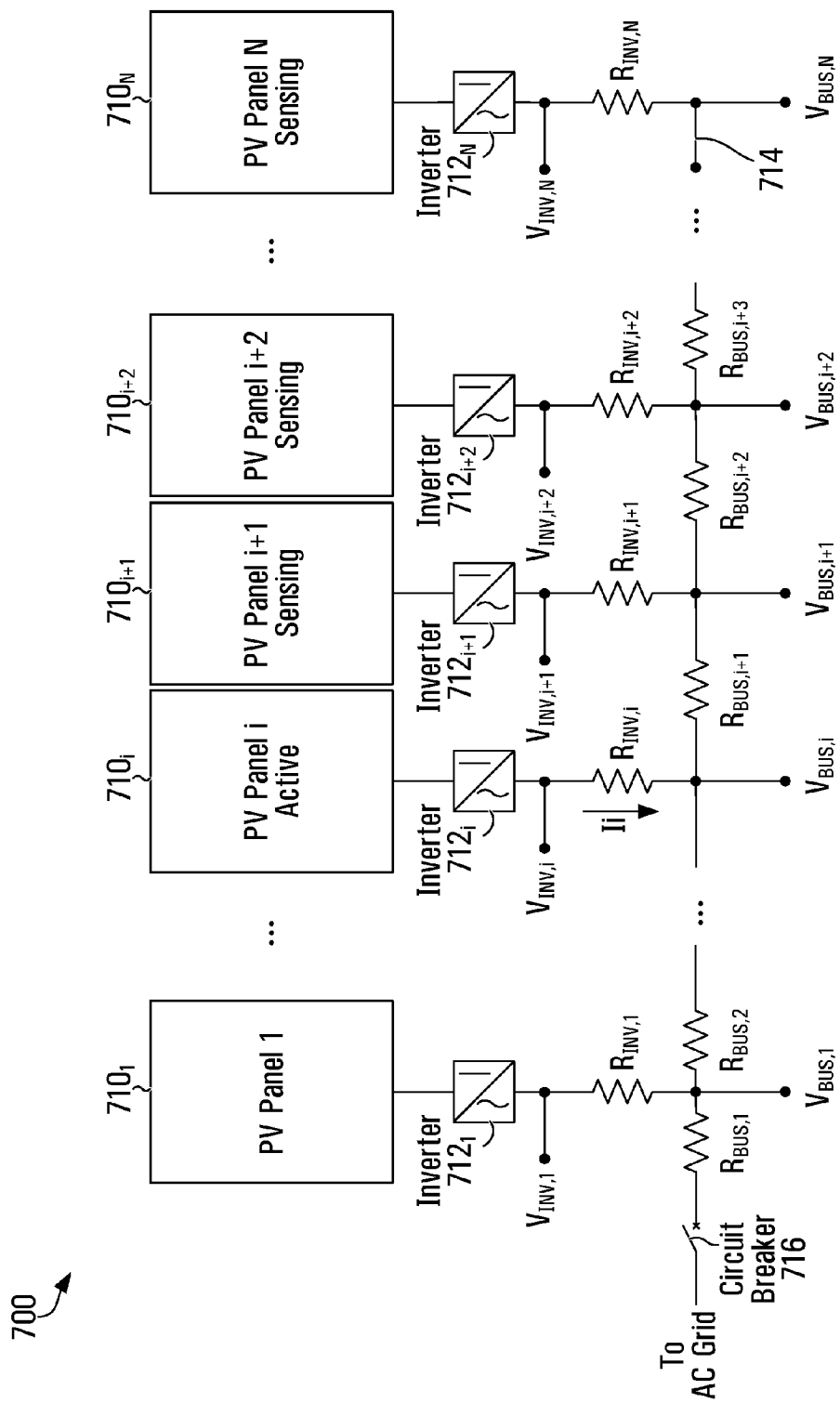
FIG. 7 is a block diagram illustrating an example of a PV array in an inverter resistance measurement mode.

FIG. 7 is a block diagram illustrating an example of a PV array in an inverter resistance measurement mode. The example PV array 700 includes N PV panels $710_1$, $710_i$, $710_{i+1}$, $710_{i+2}$, $710_N$ with respective inverters $712_1$, $712_i$, $712_{i+1}$, $712_{i+2}$, $712_N$, connected to a local power bus 714. FIG. 7 shows how the connection resistance of the i-th inverter ($R_{INV, i}$) in an array of single-phase inverters could be measured in one embodiment.

In the example shown, all inverters 712 that are "upstream" from the inverter $712_i$ (i.e., the inverters $712_{i+1}$ to $712_N$ that are further from the AC grid connection end of the local power bus 714 than the inverter $712_i$) momentarily stop supplying current to the local power bus 714 and sense the voltages at their outputs ($V_{INV, i+1}$ to $V_{INV, N}$ respectively) using their existing voltage measurement function. This mode of inverter operation is referred to herein as "inactive" or "sensing" mode. The normal mode of operation of the inverter in which it is supplying current is referred to as "active" mode. This terminology is extended herein to power generating components as well, and these states are discussed in further detail below.

Although a voltage measurement function might already be provided at each inverter for the purposes of output monitoring and control, in accordance with an embodiment of the present disclosure this function is also used in measuring voltages that are in turn used in determining connectivity or connection resistance.

While the upstream inverters $712_{i+1}$ to $712_N$ are in the inactive or sensing mode as labelled in FIG. 7, substantially no current flows through their resistances $R_{INV, i+1}$ to $R_{INV, N}$ and hence there is no substantial voltage drop across them. Similarly, substantially no current flows through cabling resistances $R_{BUS, i+1}$ to $R_{BUS, N}$ and there is no substantial voltage drop across them either. Thus, inverter voltages $V_{INV, i+1}$ to $V_{INV, N}$ will be identical, to within their measurement accuracies, and equal to the voltage on the local power bus 714 at its connection to the i-th inverter, $V_{BUS,i}$.

The inverter $712_i$ remains in the active operating mode and continues to supply current $I_i$ to the bus. The inverter $712_i$ senses its output current $I_i$ flowing through its resistance $R_{INV, i}$ and its output voltage $V_{INV,i}$. The value of the resistance can then be calculated using the formula:

$$R_{INV,i} = (V_{INV,i} - V_{BUS,i})/I_i.$$

The value of $V_{BUS,i}$ can be chosen from any of the voltages measured by the inactive or sensing inverters $712_{i+1}$ to $712_N$. In one embodiment the value from the adjacent upstream inverter $712_{i+1}$ is used. In another embodiment an average of all the individual bus voltage measurements by the upstream inverters $712_{i+1}$ to $712_N$ is used. Although the preceding formula refers to $V_{BUS,i}$, it should be appreciated that $V_{BUS,i}$ need not be measured directly, at a connection point on the local power bus 714. For example, in FIG. 7, since there is substantially no voltage drop across any of the bus or inverter resistances that are upstream from the inverter $712_i$, the voltages sensed at the outputs of the upstream inverters are substantially the same as the voltage $V_{BUS,i}$ on the local power bus 714 at the connection point at which the inverter $712_i$ connects to the local power bus. Thus, formulas provided herein reference bus voltages for ease of reference, but actual measurements need not necessarily be taken by power generating components at the physical connection points on a local power bus.

The type of measurement mode shown in FIG. 7 is referred to herein as "AS" (Active/Sensing). AS mode can be used in a sequential fashion to calculate $R_{INV}$ for all inverters 712 on the local power bus 714 except for the terminal inverter $712_N$. There is no inverter upstream of the terminal inverter $712_N$ to sense the bus voltage $V_{BUS, N}$ when the inverter $712_N$ is active. In this situation, the inverter $712_{N-1}$ momentarily stops supplying current to the local power bus 714 when the inverter $712_N$ is active, and senses $V_{BUS, N-1}$. The resistance of the series combination of $R_{inv,N}$ and $R_{BUS, N}$ ($R_{SERIES,N}$) can be calculated using the formula:

$$R_{SERIES,N} = (V_{INV,N} - V_{BUS,N-1})/I_N.$$

In this formula, $V_{BUS, N-1}$ would be the voltage measured at the output of the inverter $712_{N-1}$ (i.e., $V_{INV, N-1}$), since the inverter $712_{N-1}$ is in the sensing mode. This combined resistance value is still useful in detecting undesirable deterioration in connectivity. An increased value of this combined resistance is indicative of a connectivity issue between the terminal inverter $712_N$ and the local power bus 714.

Figure 8:
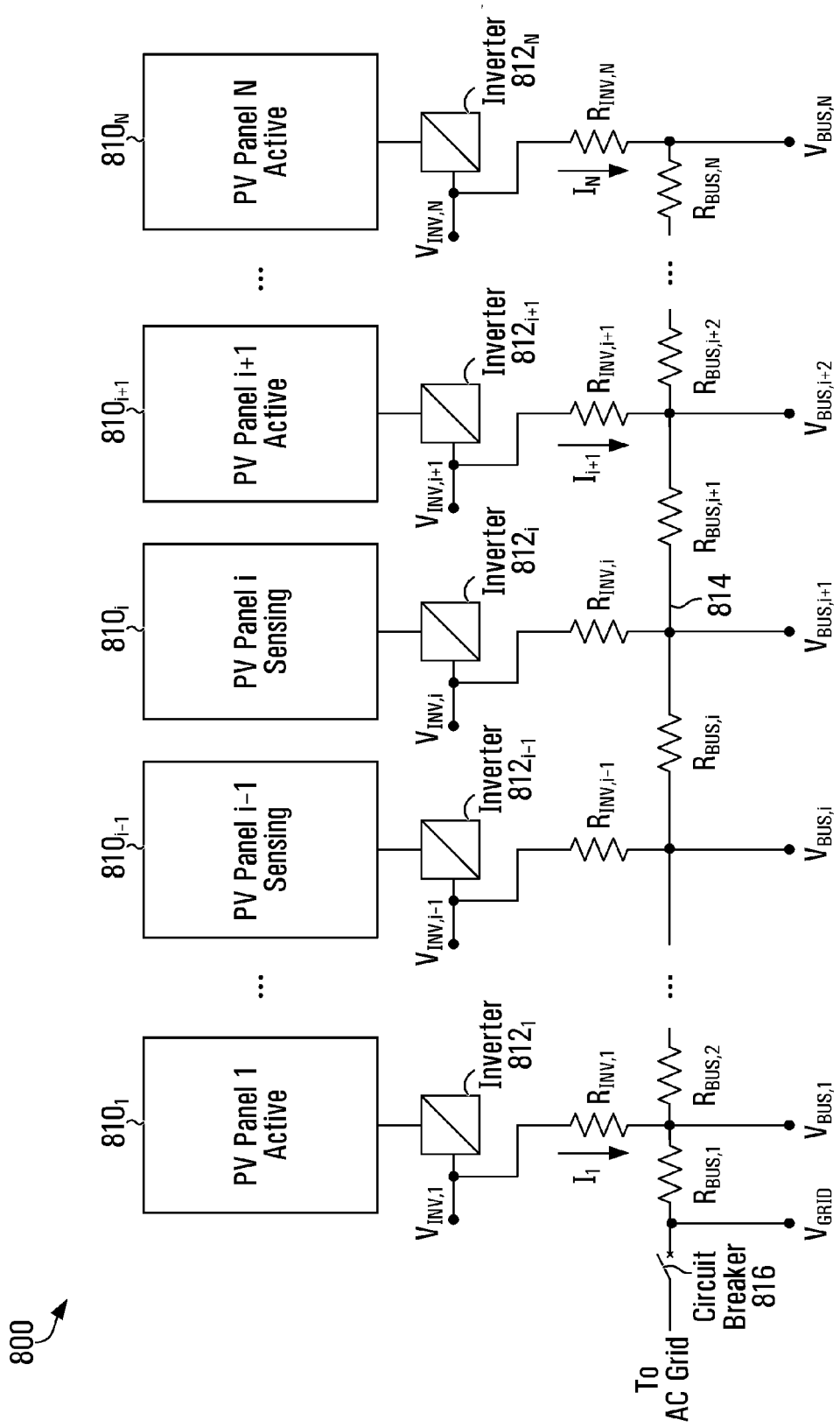
FIG. 8 is a block diagram illustrating an example of a PV array in a cable or bus resistance measurement mode.

FIG. 8 is a block diagram illustrating an example of a PV array 800 in a bus resistance measurement mode. The example PV array 800 includes N PV panels $810_1$, $810_{i-1}$, $810_i$, $810_{i+1}$, $810_N$ with respective inverters $812_1$, $812_{i-1}$, $812_i$, $812_{i+1}$, $812_N$, connected to a local power bus 814. The local power bus 814 is connected to an AC grid in some embodiments, through a circuit breaker 816. The cabling or bus resistances $R_{BUS, i}$ can be measured in the following manner as shown in FIG. 8. The inverters $812_{i-1}$ and $812_i$ are controlled to be in the sensing mode, and momentarily stop supplying current and sense the voltage at their respective outputs $V_{INV,i-1}$ and $V_{INV,i}$. Since the inverters are not supplying current, no current flows through resistances $R_{INV,i-1}$ and $R_{INV, i}$ and there is no voltage drop across them. Hence, the measured voltages at the inverter outputs are identical to their respective bus voltages $V_{BUS, i-1}$ and $V_{BUS, i}$. One or more of the remaining upstream PV panels $810_{i+1}$ to $810_N$ remain in the active operating mode and measure their respective output currents $I_{i+1}$ to $I_N$. The current flowing through resistance $R_{BUS, i}$ is the sum of these individual output currents. Thus the cabling resistance of the local power bus 814 between the connection points of the inverters $812_i$ and $812_{i-1}$ can then be calculated as $$R_{BUS,i} = (V_{BUS,i} - V_{BUS,i-1}) \bigg/ \sum_{n=i+1}^{N} I_n,$$

for $i = 2$ to $N - 1$, using the measured inverter output voltages for the $V_{BUS}$ voltages.

This measurement mode is referenced herein as "SSA" (Sensing/Sensing/Active) mode. In SSA mode one or more of the upstream PV panels $810_{i+1}$ through $810_N$ is in the active mode and supplying current to the local power bus 814. Any or all of the upstream PV panels $810_{i+1}$ through $810_N$ could be in the active mode and used to drive the local power bus 814 for the voltage measurements noted above, provided each active upstream panel that is supplying current to the local power bus also measures its output current. Although a single upstream PV panel $810_{i+1}$ through $810_N$ could be used to drive the local power bus 814 for the purposes of measure voltages for subsequent determination of the cable or bus resistance $R_{BUS,i}$, driving the local power bus with multiple upstream PV panels increases the current flowing through the cable or bus resistance and thus increases the voltage drop across the cable or bus resistance, making the voltages $V_{BUS, i-1}$ and $V_{BUS, i}$ easier to measure.

The SSA mode is suitable to measure voltages for use in calculating values of cabling resistances from $R_{BUS,2}$ to $R_{BUS, N-1}$. However, it cannot be used to calculate $R_{BUS, 1}$ and $R_{BUS, N}$ since $R_{BUS, 1}$ does not have a downstream inverter and $R_{BUS, N}$ does not have an upstream inverter.

The first bus resistance $R_{BUS,1}$ can, however, be calculated in a similar manner if the AC grid voltage $V_{GRID}$ is known, using the formula:

$$R_{BUS,1} = (V_{BUS,1} - V_{GRID}) \Big/ \sum_{n=1}^{N} I_n.$$

$V_{GRID}$ could be measured by having all the inverters 812 on the local power bus 814 momentarily stop supplying current. There will be no voltage drop across any of the bus resistances. All of the voltages $V_{INV,1}$ to $V_{INV,N}$ will be substantially identical and equal to $V_{GRID}$. In some embodiments, $V_{BUS,1}$ is measured immediately after measuring $V_{GRID}$ to minimize measurement error from drift in the value of $V_{GRID}$ between the time it is measured and the time $V_{BUS,1}$ is measured. $V_{GRID}$ could instead be measured after $V_{BUS,1}$, or measured both before and after $V_{BUS,1}$. Measurement of $V_{GRID}$ before and after $V_{BUS,1}$ is measured enables drift in $V_{GRID}$ to be determined and potentially compensated in determining $R_{BUS,1}$.

$V_{GRID}$ could also be accurately measured at the same time as $V_{BUS,1}$ using an inverter on an adjacent local power bus. For example, if $V_{BUS,1}$ is being measured on local power bus 524 in FIG. 5, then an inverter on local power bus 514 can be used to measure $V_{GRID}$. In this method, all inverters 512₁ to 512ₙ are put into sensing mode. Since substantially no current flows in local power bus 514 it will be at substantially the same voltage as $V_{GRID}$. Any one of inverters 512₁ to 512ₙ can then measure $V_{GRID}$.

The last bus resistance, $R_{BUS,N}$ can be measured in series with the $R_{INV,N}$. In this situation, an inverter 812$_{N-1}$ downstream of the inverter 812ₙ toward the circuit breaker 816 stops supplying current to the local power bus 814 and senses the voltage at its output $V_{BUS,N-1}$, while the inverter 812ₙ remains active and continues to supply current. The resistance of the series combination of $R_{INV,N}$ and $R_{BUS,N}$ can then be calculated using the formula:

$$R_{SERIES,N} = (V_{INV,N} - V_{BUS,N-1})/I_N.$$

This combined series resistance value is still useful in detecting undesirable deterioration in connectivity. Again, $V_{BUS,N-1}$ is actually the voltage $V_{INV,N-1}$ measured by the inverter 812$_{N-1}$ when the inverter is in the sensing mode.

The SSA mode maintains substantially full power generation while the measurements are taken, since only two inverters are controlled to enter the sensing mode and stop supplying current at any one time. An alternate method is for inverters 812₁ through 812$_{N-1}$ to all be in the sensing mode and only have the Nth inverter 812ₙ in the active mode and supplying current to the local power bus 814. Inverters 812₁ through 812$_{N-1}$ can then simultaneously measure the voltages at their outputs. Since these inverters 812₁ through 812$_{N-1}$ are not supplying current there is no voltage drop across their resistances $R_{INV,1}$ to $R_{INV,N-1}$. Thus, inverter voltages $V_{INV,1}$ to $V_{INV,N-1}$ will be equal to their respective bus voltages $V_{BUS,1}$ to $V_{BUS,N-1}$ and cabling resistances $R_{BUS,2}$ to $R_{BUS,N-1}$ can be calculated by the formula:

$$R_{BUS,i} = (V_{INV,i} - V_{INV,i-1})/(I_N).$$

As in the previous case the final bus resistance $R_{BUS,N}$ can only be calculated in series with the inverter resistance $R_{INV,N}$ and determining the first bus resistance $R_{BUS,1}$ involves measurement of the AC grid voltage $V_{GRID}$.

Figure 9A:
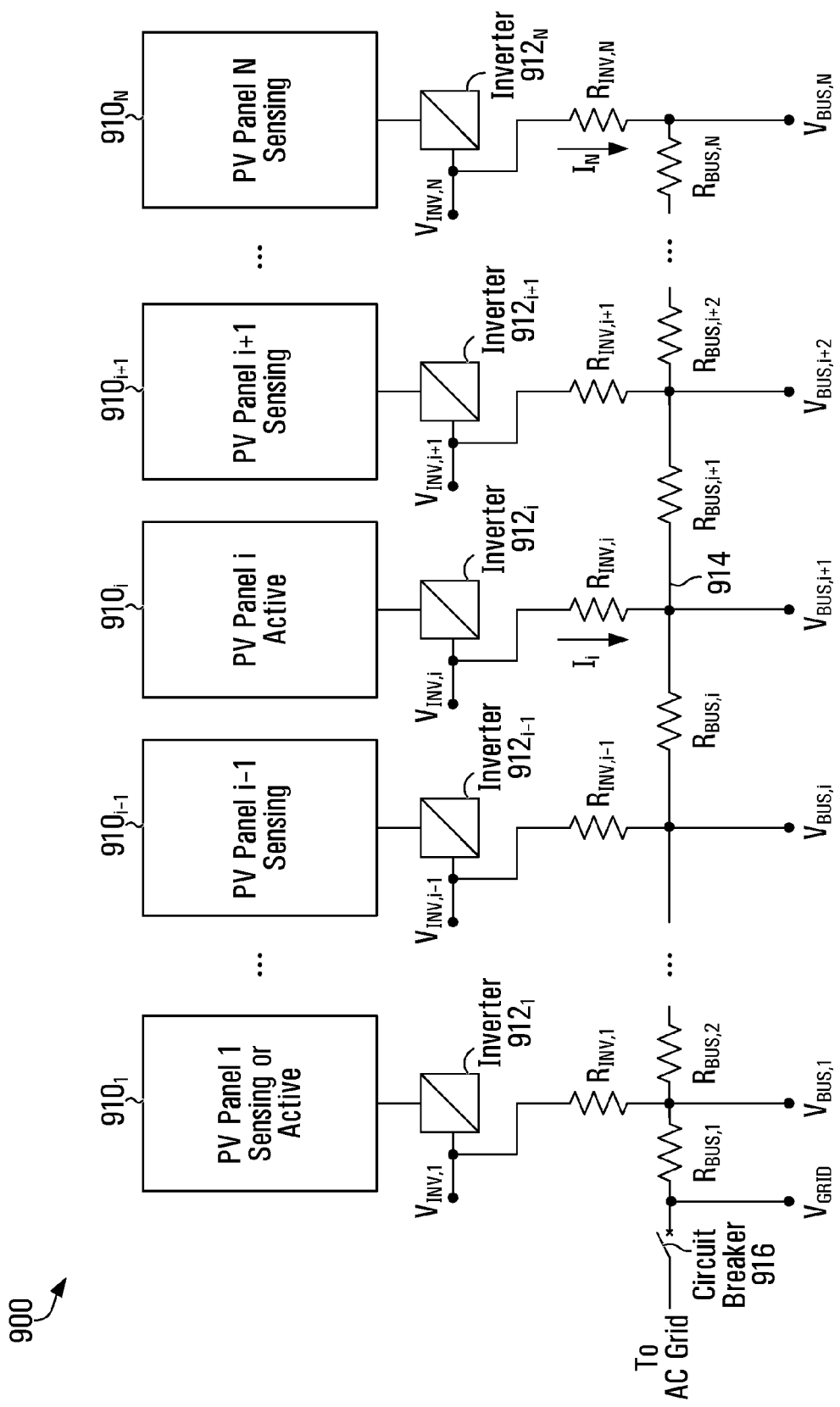
FIG. 9A illustrates an example PV array in a mode that enables both inverter and bus resistances to be determined.

FIGS. 7 and 8 illustrate an example PV array in respective modes for determining different types of resistances in the array. It should be appreciated, however, that both the cabling and inverter connection resistances could be determined in a single mode rather than in multiple modes. FIG. 9A illustrates an example PV array in a mode that enables both inverter and bus resistances to be determined. The example PV array 900 includes N PV panels 910₁, 910$_{i-1}$, 910ᵢ, 910$_{i+1}$, 910ₙ with respective inverters 912₁, 912$_{i-1}$, 912ᵢ, 912$_{i+1}$, 912ₙ, connected to a local power bus 914. The local power bus 914 is connected to an AC grid in some embodiments, through a circuit breaker 916.

With the PV panel 910ᵢ in the active mode, $I_i$ and $V_{INV,i}$ can be measured by the PV panel 910ᵢ. With the PV panels 910$_{i-1}$ and 910$_{i+1}$, which are adjacent to the PV panel 910ᵢ in the array 900, in the sensing mode, the voltages $V_{BUS,i}$ and $V_{BUS,i-1}$ can be measured by the PV panels 910$_{i+1}$ and 910$_{i-1}$. This allows all of the measurements for determining both of the resistances $R_{INV,i}$ and $R_{BUS,i}$ to be determined in one measurement cycle. This measurement mode is referenced herein as "SAS" (Sensing/Active/Sensing). Formulas for determining the resistances $R_{INV,i}$ and $R_{BUS,i}$ are provided above.

During a measurement cycle for the PV panel 910ᵢ, any PV panels downstream of the PV panel 910$_{i-1}$ could be in either the sensing mode or the active mode. Any PV panels which are upstream of the PV panel 910$_{i+1}$ are in the sensing mode.

Figure 9B:
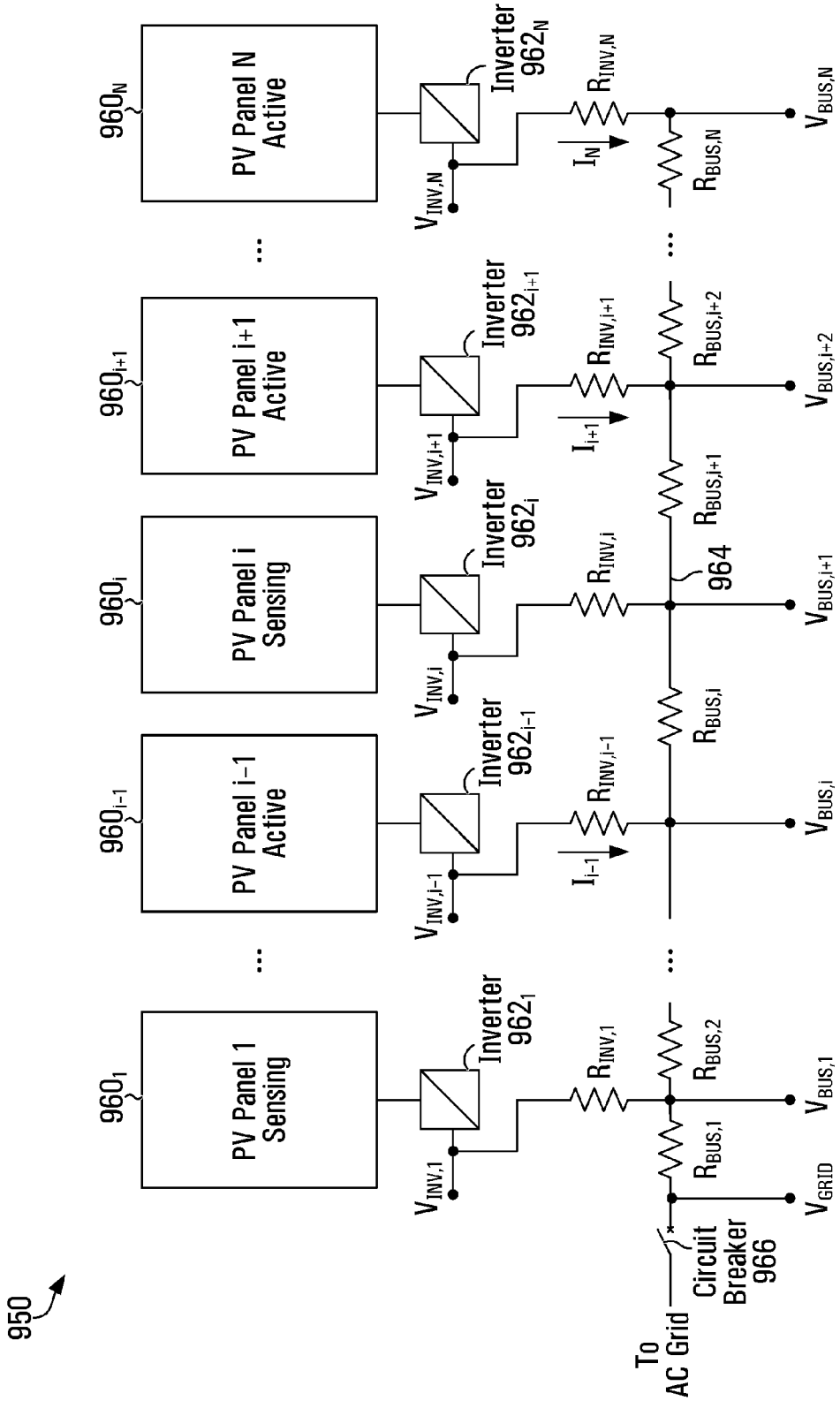
FIG. 9B illustrates an example PV array in another mode that enables bus resistances and then inverter resistances to be determined.

FIG. 9B illustrates an example PV array in another mode that enables bus resistances and then inverter resistances to be determined. The example PV array 950 includes N PV panels 960₁, 960$_{i-1}$, 960ᵢ, 960$_{i+1}$, 960ₙ with respective inverters 962₁, 962$_{i-1}$, 962ᵢ, 962$_{i+1}$, 962ₙ, connected to a local power bus 964. The local power bus 964 is connected to an AC grid in some embodiments, through a circuit breaker 966.

In the example shown, inverters 962₁ and 962ᵢ are inactive and not supplying current to the local power bus 964. All other inverters 962 are active and supplying currents $I_n$. The voltage measured by inactive inverter 962ᵢ in this configuration ($V^*_{INV,i}$) is the sum of the voltage measured by inactive inverter 962₁ ($V^*_{INV,1}$) and the voltage drops across all the bus resistances $R_{BUS,i}$ between inverter 962ᵢ's connection to the local power bus 964 and inactive inverter 962₁'s connection to the local power bus. It is given by the equation $$V^*_{INV,i} = V^*_{INV,1} + R_{BUS,2}\sum_{n=2}^{N} I_n + \Lambda + R_{BUS,i-1}\sum_{n=i-1}^{N} I_n + R_{BUS,i}\sum_{n=i}^{N} I_n.$$

There is no contribution to $V^*_{INV,i}$ from $R_{INV,i}$ since inverter 962ᵢ is inactive. It should also be noted that $I_i = 0$ when inverter 962ᵢ is in the inactive operating mode.

In this method, inverter 962₁ is kept inactive and values of $V^*_{INV,i}$ for every inverter 962ᵢ from i=2 to N−1 are measured by sequentially putting each inverter 962ᵢ into the inactive mode while keeping the remaining inverters except the inverter 962₁ in the active mode and supplying current. The equation for $V^*_{INV,2}$ is $$V^*_{INV,2} = V^*_{INV,1} + R_{BUS,2}\sum_{n=2}^{N} I_n$$

and can be solved for $R_{BUS,2}$ such that $$R_{BUS,2} = \frac{V^*_{INV,2} - V^*_{INV,1}}{\sum_{n=2}^{N} I_n}$$

where, as above, $I_2 = 0$ since the inverter 962₂ is in the inactive mode when $R_{BUS,2}$ is being determined.

The equation for $V^*_{INV,3}$ is $$V^*_{INV,2} = V^*_{INV,1} + R_{BUS,2}\sum_{n=2}^{N} I_n + R_{BUS,3}\sum_{n=3}^{N} I_n$$

and can be solved for $R_{BUS,3}$ by substitution of the value for $R_{BUS,2}$ from the previous equation.

In a similar manner all the bus connection resistances from 4 to N−1 can be calculated by substitution and a sequence of measurement cycles in which output currents of multiple active inverters and output voltages of pairs of sensing or inactive inverters are measured. A resultant system of equations could also be solved by writing them as a matrix and solving the matrix. A value for the sum of $R_{BUS,N}$ and $R_{INV,N}$ can also be calculated but involves keeping inverter $962_N$ active so that there is a voltage drop across those connection resistances. A value for $R_{BUS,1}$ can also be calculated by determining the grid voltage $V_{GRID}$. $V_{GRID}$ could be measured by having all the inverters 962 on the local power bus 964 momentarily enter the inactive state and stop supplying current. There will be no voltage drop across any of the bus resistances. All the voltages $V_{INV,1}$ to $V_{INV,N}$ will be substantially identical and equal to $V_{GRID}$, to within measurement accuracies. It is advantageous to measure $V_{BUS,1}$ immediately after measuring $V_{GRID}$ to minimize measurement error from drift in the value of $V_{GRID}$ between the time it is measured and the time $V_{BUS,1}$ is measured, as noted previously. It may be advantageous to also measure $V_{GRID}$ immediately after measuring $V_{BUS,1}$ to check that $V_{GRID}$ has not drifted excessively.

Alternatively, $R_{BUS,1}$ could be calculated from the various values of $V^*_{INV,1}$ and $I_n$ measured previously. Since $$V^*_{INV,1} = V_{GRID} + R_{BUS,1}\sum_{n=1}^{N} I_n$$

$R_{BUS,1}$ can be calculated by subtracting pairs of equations for $V^*_{INV,1}$ which eliminates $V_{GRID}$ and solving for $R_{BUS,1}$. By using multiple pairs of equations for $V^*_{INV,1}$ any drift in the value of $V_{GRID}$ between pairs of measurements will be averaged out.

An advantage of the above bus resistance method is that only two inverters stop supplying current at any one time. The power output of the array can therefore be maximized.

Once values for the bus resistances $R_{BUS,i}$ have been determined, values for inverter to bus resistances $R_{INV,i}$ can next be determined for all inverters from i=2 to N.

All inverters are put into the active mode except for inverter $962_1$ and simultaneous measurement of all inverter's voltages $V_{INV,n}$ and output currents $I_i$ are made.

The voltage at the output of active inverter $962_i$ is the sum of the voltage measured by inactive inverter $962_1$ ($V^*_{INV,1}$), the voltage drops across all the bus resistances between the inverter $962_i$'s connection to the local power bus 964 and inactive inverter $962_1$'s connection to the local power bus and the voltage drop across the inverter $962_i$'s own resistance $R_{INV,i}$. It is given by the equation:

$V_{INV,i} =$ $V^*_{INV,1} + R_{BUS,2}\sum_{n=2}^{N} I_n + \Lambda + R_{BUS,i-1}\sum_{n=i-1}^{N} I_n + R_{BUS,i}\sum_{n=i}^{N} I_n + I_i \times R_{INV,i}$ Since the values of $R_{BUS,i}$ are known from the previous $V^*_{INV}$ measurements the above equation can be solved for values of $R_{INV,i}$ for i=2 to N−1.

$$R_{INV,i} = \frac{V_{INV,i} - V^*_{INV,1} - R_{BUS,2}\sum_{n=2}^{N} I_n - \Lambda - R_{BUS,i-1}\sum_{n=i-1}^{N} I_n - R_{BUS,i}\sum_{n=i}^{N} I_n}{I_i}.$$

For inverter $962_1$, $R_{INV,1}$ can be determined by an additional measurement in which inverter $962_1$ is active and $V_{GRID}$ is measured. The voltage of inverter $962_1$ ($V_{INV,1}$) is given by the equation below and can be solved for $R_{INV,1}$ since $R_{BUS,1}$ is known.

$$V_{INV,i} = V_{GRID} + R_{BUS,1}\sum_{n=1}^{N} I_n + I_i \times R_{INV,1}.$$

The above method has the advantage of not requiring any inverters to be inactive during the measurements of $R_{INV,i}$ and only two inverters to be inactive at any one time during the measurement of $R_{BUS,i}$, thus maximizing the power output of the array. It also has the advantage that only N+2 sets of measurements are required to characterize the connections.

Figure 10:
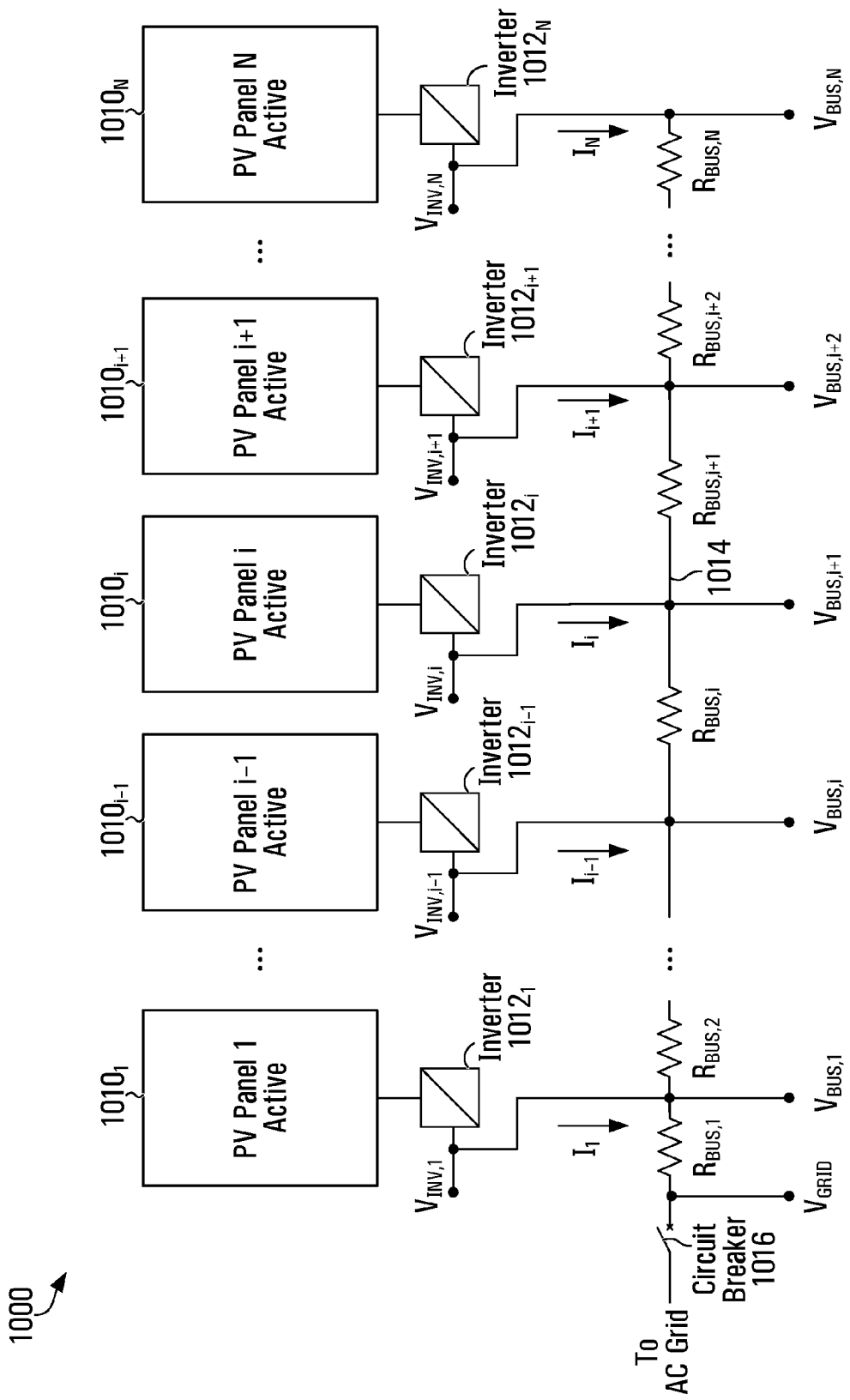
FIG. 10 illustrates an example PV array in a mode that enables bus resistances to be determined when inverter resistances are negligible.

In some embodiments, the values of $R_{INV}$ are negligible. In FIG. 4, for example, $R_{INV}$ is likely to be negligible since the T-junction 408 is inside the inverter 404 and could be protected from the weather. FIG. 10 illustrates an example PV array in a mode that enables cable or bus resistances to be determined when inverter connection resistances are negligible. The example PV array 1000 includes N PV panels $1010_1$, $1010_{i-1}$, $1010_i$, $1010_{i+1}$, $1010_N$ with respective inverters $1012_1$, $1012_{i-1}$, $1012_i$, $1012_{i+1}$, $1012_N$, connected to a local power bus 1014. The local power bus 1014 is connected to an AC grid in some embodiments, through a circuit breaker 1016. In this example with negligible inverter connection resistances, no $R_{INV}$ resistances are shown, and only the cable resistances $R_{BUS}$ are determined.

All of the PV panels $1010_1$, $1010_{i-1}$, $1010_i$, $1010_{i+1}$, $1010_N$ are in the active mode and supply respective currents $I_1$, $I_{i-1}$, $I_i$, $I_{i+1}$, $I_N$, which are measured at each inverter $1012_1$, $1012_{i-1}$, $1012_i$, $1012_{i+1}$, $1012_N$, to the local power bus 1014. With negligible inverter connection resistances, the voltages $V_{INV,1}$ $V_{INV,i-1}$ $V_{INV,i}$ $V_{INV,i+1}$ $V_{INV,N}$ measured at the inverter outputs are equal to the bus voltages $V_{BUS,1}$ $V_{BUS,i-1}$ $V_{BUS,i}$ $V_{BUS,i+1}$ $V_{BUS,N}$ state, $I_i$ and $V_{INV,i}$. The measured currents and voltages allow all of the bus resistances $R_{BUS,2}$ through $R_{BUS,N}$ to be determined as follows:

$$R_{BUS,i} = (V_{BUS,i} - V_{BUS,i-1}) \bigg/ \sum_{n=i}^{N} I_n,$$

for i = 2 to N, where the $V_{BUS}$ values are the voltages measured at the inverter outputs.

The first bus resistance can be determined in a similar manner, if the grid voltage $V_{GRID}$ is measured or known:

$$R_{BUS,1} = (V_{BUS,1} - V_{GRID}) \bigg/ \sum_{n=1}^{N} I_n,$$

where $V_{BUS,1} = V_{INV,1}$ as measured at the output of the inverter $1012_1$.

This measurement mode is referenced herein as AA (All Active).

The foregoing description makes reference to PV panels and inverters. In a more general sense, techniques as disclosed herein are applicable to power generating components, which in an embodiment could include a PV panel and a micro-inverter.

In an array of three-phase inverters, methods analogous to the single-phase approaches described above can be used to determine the inverter and bus resistances in each power line of the array. A three-phase inverter will typically have at least three physical wires corresponding the three line voltages (A,B,C), as will its corresponding AC local power bus. A fourth physical wire for neutral and which is normally non-current carrying in a balanced system is also frequently present.

Figure 11:
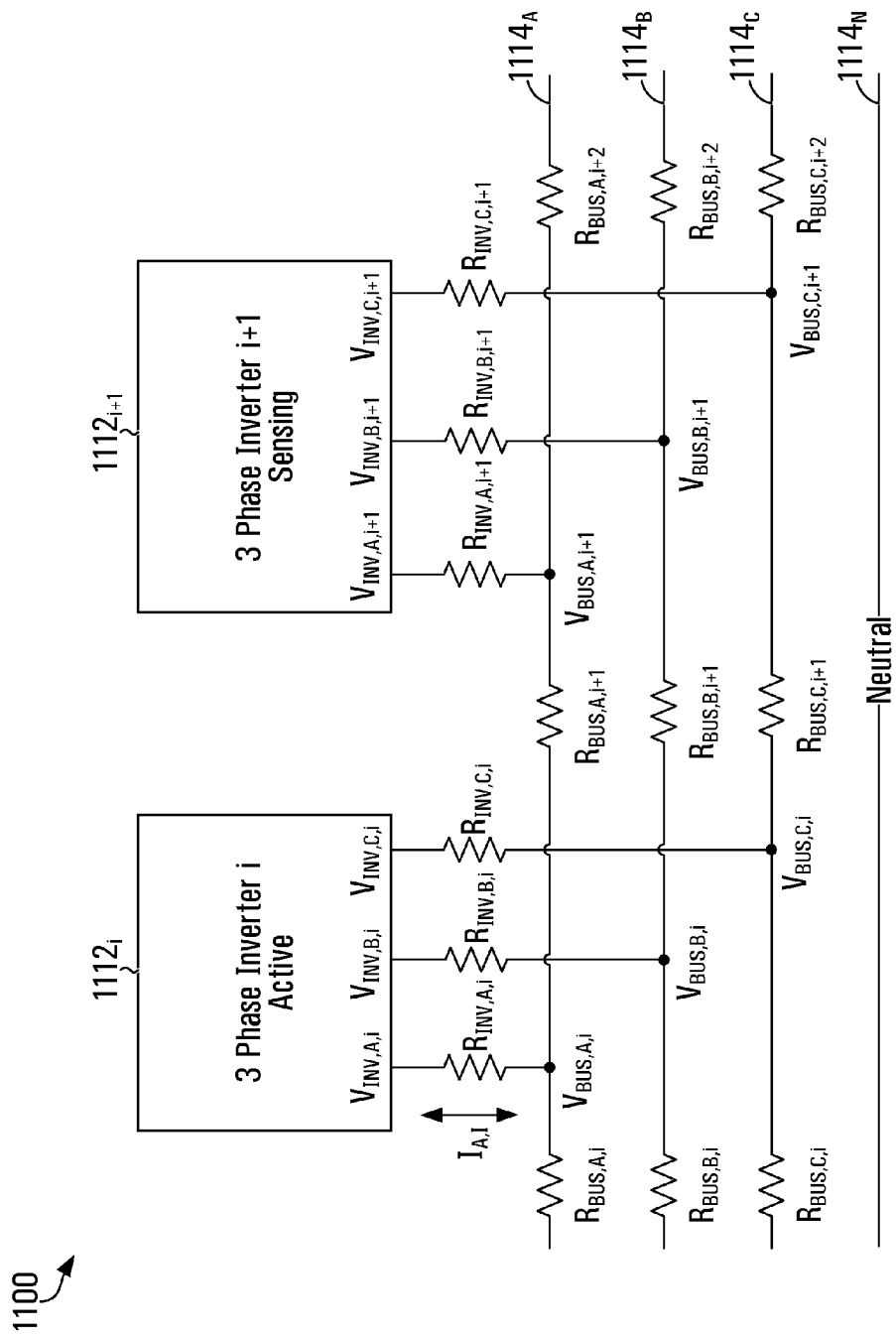
FIG. 11 is a block diagram illustrating an example of three-phase inverter resistances.

FIG. 11 is a block diagram illustrating an example of three-phase inverter resistances in a PV array 1100 using three-phase inverters $1112_i$, $1112_{i+1}$. The resistances between the i-th inverter $1112_i$ and the three-phase local power bus for the voltage lines A $1114_A$, B $1114_B$, and C $1114_C$ are $R_{INV, A, i}$, $R_{INV, B, i}$, $R_{INV, C, i}$ respectively. The resistance of the cabling between inverters $1112_i$ and $1112_{i+1}$ for line voltages A, B and C are $R_{BUS, A, i}$, $R_{BUS, B, i}$ and $R_{BUS, C, i}$ respectively. For completeness a neutral conductor $1114_N$ is also shown.

To determine the inverter resistances, in one embodiment all inverters upstream from the i-th inverter $1112_i$ momentarily stop supplying current to the local power bus and sense the line voltages at their outputs using their voltage measurement function. The inverter $1112_i$ remains active and continues to supply current to the local power bus. The inverter $1112_i$ senses its output line currents and voltages.

The inverter resistance for phase PH of the i-th inverter $R_{INV,PH,i}$ can be calculated using the formula:

$$R_{INV,PH,i} = (V_{PH,i} - V_{PH,BUS,i}) \div I_{PH,i},$$

where PH can have the value of A, B or C in the example shown.

Bus resistances in each of the voltage lines can be calculated in one embodiment using methods analogous to those disclosed herein in the context of the AS, SSA and SAS single-phase measurement modes.

For example, the $R_{BUS}$ values could be calculated from voltage and current measurements where the inverters $1112_i$ and $1112_{i+1}$ are in the operating modes shown in FIG. 11, and the inverter which is immediately downstream from the inverter $1112_i$ is in the sensing mode as described above for the SAS single-phase case.

In another embodiment, analogous to the SSA single phase mode, the inverters $1112_i$ and $1112_{i+1}$ momentarily enter the sensing mode, stop supplying current, and sense the line voltages at their respective outputs $V_{INV, A, i}$, $V_{INV, B, i}$, $V_{INV, C, i}$ and $V_{INV, A, i+1}$, $V_{INV, B, i+1}$, $V_{INV, C, i+1}$. Since the inverters $1112_i$ and $1112_{i+1}$ are not supplying current, no current flows through resistors $R_{INV, i}$ and $R_{INV, i+1}$ and there is no voltage drop across them. Hence, the measured line voltages at the inverter outputs are identical to their respective bus voltages $V_{BUS, A, i}$, $V_{BUS, B, i}$, $V_{BUS, C, i}$ and $V_{BUS, A, i+1}$, $V_{BUS, B, i+1}$, $V_{BUS, C, i+1}$. One or more of the remaining upstream PV panels (i+2 to N, not shown in FIG. 11) remain in the active mode and measure their respective output line currents $I_{A, i+2}$, $I_{B, i+2}$, $I_{C, i+2}$ to $I_{A, N}$, $I_{B, N}$, $I_{C, N}$. The current flowing through the bus resistance in each phase PH at the connection location for each inverter i is the sum of the individual PV panel currents in that phase. Thus, the bus resistance for phase PH (where PH may be A, B or C) at location i ($R_{BUS, PH, i}$) is:

$$R_{BUS,PH,i} = (V_{BUS,PH,i} - V_{BUS,PH,i-1}) \bigg/ \sum_{n=i+1}^{N} I_{PH,n},$$

with the measured $V_{INV}$ voltages being used as the $V_{BUS}$ voltages in the formula.

Other techniques disclosed herein in the context of single-phase arrays may similarly be extended to multiple-phase arrays as well.

Figure 13:
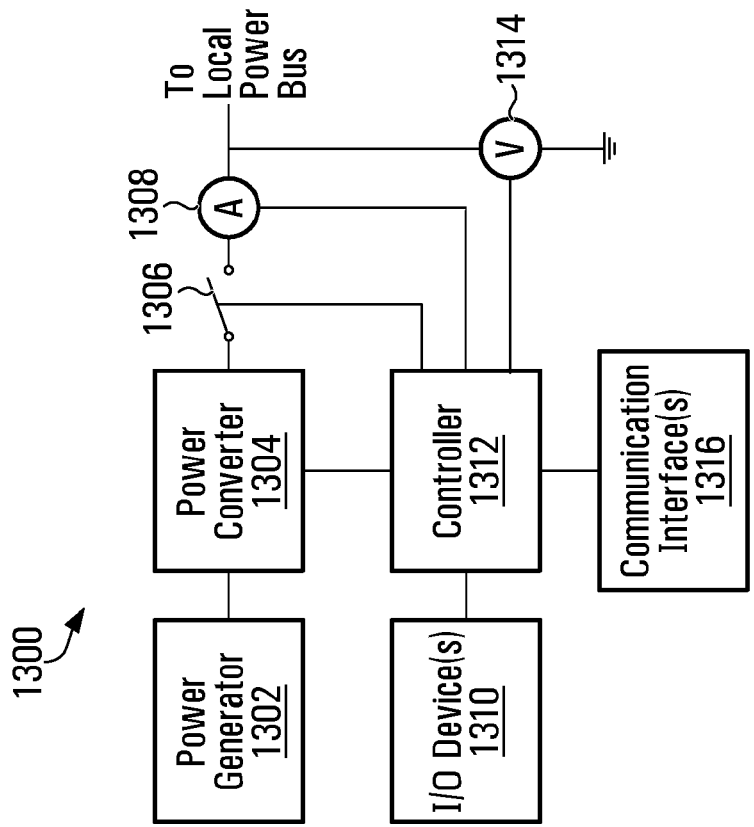
FIG. 13 is a block diagram illustrating an example array monitor.
Figure 12:
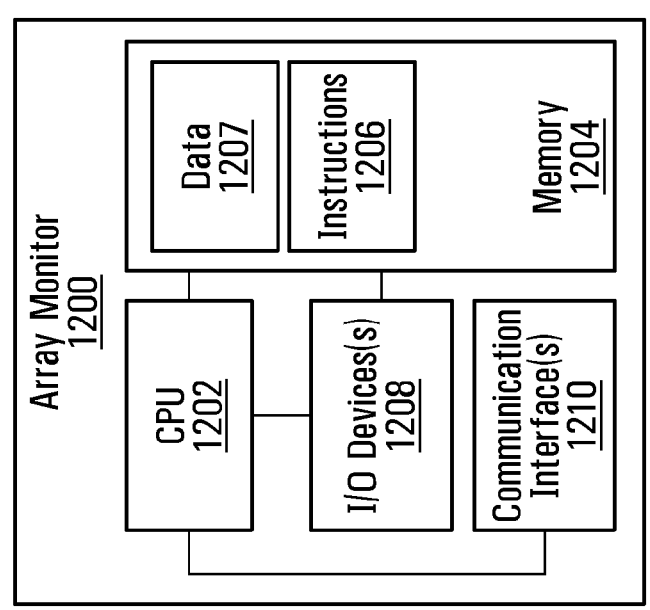
FIG. 12 is a block diagram illustrating an example power generating component

The foregoing description considers PV panel connectivity techniques at a relatively high level of the panels and an array. FIGS. 12 and 13 include block diagrams illustrating examples of an array monitor 1200 and a power generating component 1300. The co-ordination of the operation of PV panels and inverters to perform the measurement operations disclosed herein, as well as possible calculation of resistance values, could be carried out by an array monitor, an example of which is depicted in FIG. 13.

The example array monitor 1200 comprises a processor 1202, which may be provided by a central processing unit (CPU) as shown, and memory 1204 connected to the processor. The memory 1204 may comprise random access memory (RAM) and/or other types of memory and may be provided separate from the processor 1202, as part of the processor 1202, or include both separate and processor-integrated memory. The memory 1204 may further comprise non-volatile memory such as magnetic disk, flash memory or Electrically Erasable Programmable Read Only Memory (EEPROM) for providing storage when the example array monitor 1200 is powered off. The example array monitor 1200 further comprises one or more input/output (I/O) devices 1208. For example, a display and a keyboard are examples of I/O devices 1208. The communication interface 1210 may include one or more interfaces of the same type or different types, to enable the example array monitor 1200 to communicate with and remotely control power generating components, and/or for communicating with other computers or the internet for instance. The communication interface, or interfaces, 1210 may comprise a wired and/or wireless communication interface. The memory 1204 stores instructions 1206, that when executed by the processor 1202 provide one or more techniques for measuring the resistances of a power generation array in one embodiment. The memory 1204 in the example shown in FIG. 12 also stores data 1207 associated with measurements taken from the array, resulting calculations performed on the measurements and/or parameters for the execution of instructions 1206.

As noted above, a communication interface 1210 at the example array monitor 1200 enables communication with power generating components in an array, in which the power generating components are connected in parallel to a local power bus. The CPU 1202 could be used in one embodiment to implement a connectivity resistance monitor, operatively coupled to the communication interface 1210, to control a power generating component to measure an output current supplied to the power bus by the power generating component; to control respective first and second power generating components to measure a first voltage at an output of the first power generating component and a second voltage at an output of the second power generating component; and to determine a resistance in the array between first and second connection points in the array through which the output current flows, based on the measurements of the output current, the first voltage, and the second voltage.

Control of power generating components by an array monitor such as 1200 may also involve controlling power generating component to be in the inactive or sensing mode or in the active mode. Any of the measurement modes disclosed herein could be used in determining resistances.

A power generation array includes power generating components, an example of which is shown at 1300 in FIG. 13. The example power generation component 1300 includes a power generator 1302, a power converter 1304 operatively coupled to the power generator, a controller 1312 operatively coupled to the power converter, and one or more communication interfaces 1316 operatively coupled to the controller. An output switch 1306, an ammeter 1308, a voltmeter 1314, and one or more input/output device(s) 1310, all operatively coupled to the controller 1312, are also shown.

The power generator 1302 is a PV panel in one embodiment, although in other embodiments, the power generator could include a wind generator, a fuel cell, and/or a battery bank, for example. The power converter 1304 is a DC to AC inverter in one embodiment, for converting DC power generated by the power generator 1302 into AC power. The controller 1312 controls operation of the power converter 1304 and the output switch 1306, and might be implemented in hardware, firmware, components for executing software stored in a memory (not shown), or some combination thereof. Example implementations include one or more processors executing software stored in computer-readable storage, Application Specific Integrated Circuits (ASICs), Programmable Logic Devices (PLDs), and/or Field Programmable Gate Arrays (FPGAs), for instance. In one embodiment, the example array monitor 1200 and the example power generating component 1300 operate in conjunction with each other to enable resistances in a power generation array to be determined. The communication interface 1316 would then include an interface that is compatible with a communication interface 1210 at the example array monitor 1200. Other types of communication interfaces could also be provided.

The example array monitor 1200 may determine resistances on a periodic, scheduled basis and/or on demand, by controlling power generating components such as 1300 in an array. For instance, connection resistances might be determined immediately after power generating component installation to flag any installation issues and also establish baselines values. Connection resistances could then be performed periodically at regularly scheduled intervals after that. Connection resistances could also or instead be performed on demand, illustratively after a critical event which might cause damage to the array such as a wind storm, heavy snowfall, lightning storm or freezing rain.

The example array monitor 1200 could generate a fault signal based on a resistance exceeding a threshold value. The threshold value might be chosen to be a specific value of resistance or it might be determined based on a percentage increase in the resistance from its original baseline value. The fault signal could take the form of an audible alert, a visual alert, a tactile alert, and/or some other form of alert. The I/O device(s) 1208 could include a display for example, which is controlled by the CPU 1202 to display a map of the panel array and change the color of a connection on the map from green to red, for example, when a resistance is above a threshold. Fault reporting to another device, through a communication interface 1210, is also contemplated. A fault signal could also or instead be provided at a power generating component for which a connection resistance is above a threshold, using an I/O device 1310. An LED that changes from a normal color to a fault color, such as green to red for instance, might enable maintenance or service personnel to more easily locate a power generating component nearest a faulty connection. An LED at a panel flashing or displaying a fault color might signal an inverter or connector issue, and LEDs in adjacent panels flashing or displaying a fault color could be used to indicate an issue on the local power bus between connection points of those at which those panels' inverters connect to the local power bus.

The example array monitor 1200 could provide functionality including trend analysis for a power generation array. For example, the array monitor 1200 could provide extrapolated remaining life or time to failure projections based on a time series of previously determined resistance values.

The example array monitor 1200 could be located adjacent to an array and communicate directly with the power generating components of the array. In another embodiment, the example array monitor 1200 could be located remotely from the array, in which case the power generating components of the array could communicate with the array monitor through a local relay station, with the relay station communicating with the array monitor over a telecommunication network. The power generating components of the array could communicate with the example array monitor 1200 or relay station through wired or wireless means which might including powerline communications, radio frequency communications, infrared communications and/or acoustic communications.

At a system level, an embodiment of the invention may provide a power generation system with an array of a plurality of power generating components such as the example power generating component 1300 in FIG. 13, connected in parallel to a local power bus, and an array monitor. At least one of the power generating components measures an output current that it supplies to the local power bus, and respective first and second power generating components measure a first voltage at an output of the first power generating component and a second voltage at an output of the second power generating component. The array monitor determines a resistance in the array between first and second connection points in the array through which the output current flows, based on the measurements of the output current, the first voltage, and the second voltage.

The resistance calculation based on the measured current and voltages could be performed at one or more power generating components and/or at the array monitor. For example, the controller 1312 in FIG. 13, or possibly another element of a power generating component, could calculate the resistance based on the measurements of the output current, the first voltage, and the second voltage, provided it makes or receives the measurements. A calculated resistance could be transmitted to the array monitor 1200 in FIG. 12 by the controller 1312 through a communication interface 1316 and a compatible array monitor communication interface 1210. In this case, the array monitor 1200 determines a resistance by receiving the calculated resistance from a power generating component.

The power generating components might also or instead transmit the measured output current, the first voltage, and the second voltage to the array monitor, and the array monitor determines the resistance by calculating the resistance based on the measurements of the output current, the first voltage, and the second voltage. Measurements could be obtained by the controller 1312 (FIG. 13) from the ammeter 1308 and/or the voltmeter 1314 in each power generating component 1300 that is to take a measurement in a measurement cycle. The measurement(s) taken by each power generating component 1300 may then be transmitted to the array monitor 1200 by each controller 1312 through a communication interface 1316 and received by the array monitor through a compatible communication interface 1210. The processor, a CPU 1202 in the example shown in FIG. 12, at the array monitor 1200, determines the resistance by calculating it from the received current and voltage measurements.

For determination of an inverter connection resistance $R_{INV,i}$ as illustrated in FIG. 7 or FIG. 9A, for example, one power generating component, namely the i-th power generating component that includes the i-th PV panel and the i-th inverter in this example, measures the output current and the first voltage, and a second power generating component, namely the adjacent upstream (i+1)-th power generating component that includes the (i+1)-th PV panel and the (i+1)-th inverter, measures the second voltage. The upstream power generating component is controlled by the array monitor to be in the inactive or sensing mode not outputting current to the local power bus. In the inactive or sensing mode, the measured voltage at the output of the upstream power generating component is equivalent to the voltage on the local power bus at the connection point at which the i-th power generating component is connected to the bus.

Control of a power generating component to be in the inactive or sensing mode could involve transfer of a control signal from the array monitor processor 1202 to the power generating module controller 1312 through communication interfaces 1210, 1316. Responsive to the control signal, the controller 1312 opens the output switch 1306. In the case of a PV panel as the power generator 1302, the panel output current goes to zero when the output switch 1306 is opened, and the PV panel maintains an open circuit voltage at the input side of the output switch. Although current at the ammeter 1308 is zero when the output switch 1306 is open, the voltmeter 1314 is still able to measure a voltage at the connection side of the output switch, which is the voltage at a connection point in the power generation system when there is no output current from the power generating component and therefore there is no voltage drop across a resistance between the power generating component and the local power bus.

For determination of a bus or cable resistance, at least three power generating components are involved. One or more power generating components measure their output currents, and two power generating components that are in the sensing mode measure voltages at their respective outputs, which are at substantially the same voltages as connection points on the local power bus. With reference to FIG. 8, at least the (i+1)-th power generating component measures its output current, as do any further upstream power generating components if they are in the active mode and supplying output current to the local power bus 814. The i-th and (i−1)-th power generating components are in the sensing mode and measure voltages at their outputs, which are substantially the same as the voltages at two connection points on the local power bus 814. In this example, the first and second voltages are the local power bus voltages at the connection points at which the i-th and (i−1)-th power generating components are connected to the local power bus.

If multiple upstream power generating components are in the active mode and supplying output currents to the local power bus 814, then the total current flowing through the connection points for which voltages are measured by sensing power generating components includes contributions from all of those upstream power generating components. Thus, a resistance calculation may take into account not only the current measured by one power generating component, but also currents measured by all active power generating components that are upstream from a bus or cable resistance being calculated.

Similarly, multiple voltage measurements could be taken into account in calculating resistances. An average of voltages measured by the (i+1)-th to N-th upstream power generating components in FIG. 10, for example, could be used as the bus voltage $V_{BUS,i}$ in calculating the resistance $R_{BUS,i}$.

In the case of an N-th terminal power generating component resistance, the N-th power generating component measures its output current and the voltage at its output. The (N−1)-th adjacent and downstream power generating component downstream, in the sensing mode, measures a second voltage at its output, which is substantially equivalent to the voltage on the local power bus at its connection point. The combination of a resistance between the N-th power generating component and the local power bus and a resistance between connection points at which the N-th and (N−1)-th power generating components are connected to the local power bus can then be determined.

Figure 15:
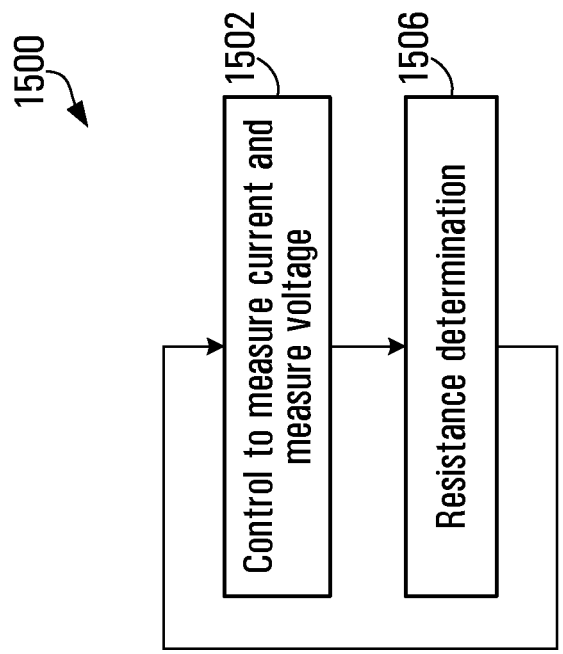
FIG. 15 is a flow diagram illustrating another example method.
Figure 14:
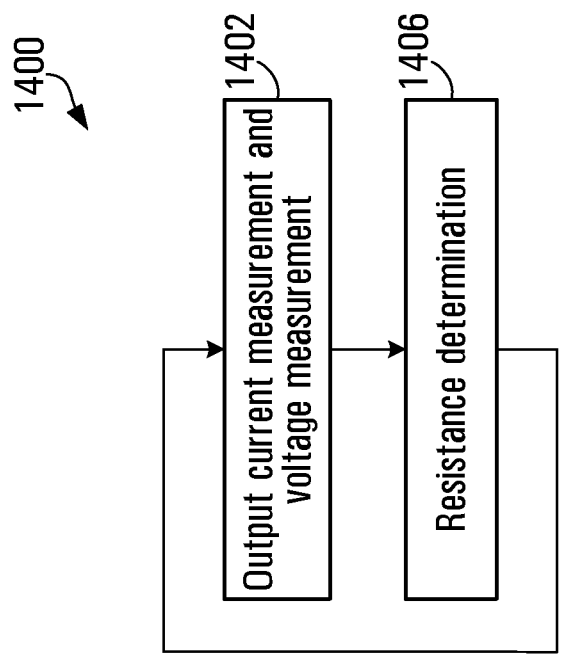
FIG. 14 is a flow diagram illustrating an example method.

The description above relates primarily to system or apparatus embodiments of connectivity resistance monitoring techniques. Other embodiments, in the form of methods, are also contemplated. FIGS. 14 and 15 are flow charts illustrating examples of such methods.

The example method 1400 (FIG. 14) is a method for determining resistances in an array of power generating components connected in parallel to a power bus, and involves measurement at 1402, by a power generating component, of an output current supplied to the power bus by the power generating component. Simultaneously with the output current measurement, voltage measurements are also taken at 1402, by respective first and second power generating components, of a first voltage at an output of the first power generating component and a second voltage at an output of the second power generating component. Determination of a resistance in the array between first and second connection points in the array through which the output current flows, based on the measurements of the output current, the first voltage, and the second voltage, is shown at 1406.

At 1402, the measurement of an output current could include measurement, by each of the power generating components, of a respective output current supplied to the power bus. Measurement of a first voltage and a second voltage at 1402 might then include measurement, by each of the power generating components, of a respective voltage at a respective output of each power generating component. The sensing or measurement points at the power generating component outputs are at the same potential as connection points in the array at which each power generating components is connected to the power bus, when the power generating components are in the sensing mode or when inverter resistances are negligible. The resistance determination at 1406 could then involve determination of a respective resistance between adjacent connection points at which the power generating components are connected to the power bus.

The flow chart in FIG. 15 illustrates another example method 1500 for determining resistances in an array of power generating components connected in parallel to a power bus, The example method 1500 involves, at 1502, control of a power generating component to measure an output current supplied to the power bus by the power generating component, and control of respective first and second power generating components to measure a first voltage at an output of the first power generating component and a second voltage at an output of the second power generating component, and determination 1506 of a resistance in the array between first and second connection points in the array through which the output current flows, based on the measurements of the output current, the first voltage, and the second voltage. These operations could be performed, for example, by an array monitor.

Determination of resistance at 1506 involves, in some embodiments, receipt of the output current, the first voltage, and the second voltage from the power generating component that measures the output current and the respective first and second power generating components that measure the first voltage and the second voltage. From the received measurements, the resistance can be calculated.

It should be appreciated that the example methods 1400 and 1500 are intended solely for illustrative purposes. Other embodiments could include further, fewer, and/or different operations, performed in a similar or different order than shown. For instance, the example methods 1400, 1500 could be repeated periodically on manual control, or otherwise. This is represented generally in FIGS. 14 and 15 by the return arrows from 1406/1506 to 1402/1502. However, resistance need not necessarily be determined at 1406/1506 before the next current/voltage measurement cycle. Measurements could be stored, for instance, for subsequent determination of resistance.

Further variations of the example methods 1400, 1500 may be or become apparent. Various options for performing the operations shown in FIGS. 14 and 15, and examples of additional operations that could be performed in some embodiments, will be apparent from the foregoing system and apparatus descriptions, for instance.

Embodiments disclosed herein could be useful in monitoring resistance of power generation array connections in-situ in an automated and periodic fashion, and flagging undesirable trends in resistance for maintenance before serious issues develop.

Existing voltage and current measurement functions of power inverters are currently only used to report on power generation and the health of the inverter. In accordance with the present application this measurement functionality is further exploited in a new and inventive manner to report on the health of inverters' connections.

Systems and methods for determining resistances in a power system are disclosed. These resistances could in turn be used for any of various purposes. For instance, resistance values and/or trends in determined resistance values could be used to predict time to failure. An inverter resistance that reaches a predetermined value or increases by a certain amount over a period of time could signal an impending connectivity issue. That issue could then be addressed during preventative maintenance, or when other maintenance is being performed on a power system, to avoid emergency maintenance when connectivity further degrades or fails entirely.

What has been described is merely illustrative of the application of principles of embodiments of the invention. Other arrangements and methods can be implemented by those skilled in the art without departing from the scope of the present invention.

For example, the divisions of function represented in the drawings are illustrative, and accordingly apparatus implementations may include further, fewer, or different components, interconnected in a similar or different manner than explicitly shown in the drawings. Methods according to other embodiments than those shown in the drawings may similarly include further, fewer, and/or different operations, performed in a similar or different order than shown.

It should also be appreciated that the techniques disclosed herein could be employed in other scenarios, such as the situation of a DC bus with DC to DC converters attached to individual PV panels, for instance. In this case, the co-ordinated operation of the converters is substantially identical to the AC case with DC to AC inverters.

In the present disclosure, reference is made to currents and voltages using uppercase letters. This should not be interpreted as an indication that the techniques disclosed herein are in any way limited to RMS (root mean square), steady-state or DC values. The disclosed techniques could be applied to time-varying values of currents and/or voltages, as will be apparent, for example, from teachings in respect of inverters, AC systems, and single- and multi-phase systems.

Similarly, voltages and currents need not necessarily be limited to scalar values. Vector properties could be exploited in some embodiments.

For instance, in another embodiment the current supplied by the inverters during connectivity monitoring measurements is at a non-zero phase angle with respect to the grid voltage. In FIG. 7, for example, active inverter $712_i$ could supply current at a phase $\theta$ relative to the voltage on the local power bus 714. The real power supplied by inverter $712_i$ is $$P = I_i \times V_{INV,i} \cos \theta.$$

The current that inverter $712_i$ injects into the local power bus 714 is $$I_i = \frac{P}{V_{INV,i} \cos \theta}.$$

Since $\cos \theta < 1$ for any value of $\theta$ other than zero or $2\pi$, the injected current $I_i$ can be advantageously increased by using a non-zero phase angle. The value of phase angle $\theta$ can be chosen such that inverter $712_i$ supplies its maximum rated current capacity regardless of the level of insolation on its associated PV panel $710_i$. In FIG. 7 the larger current $I_i$ will create a larger voltage drop across inverter resistance $R_{INV,i}$ making the determination the resistance more accurate. The inverter resistance $R_{INV,i}$ is given by the equation $$R_{INV,i} = \frac{\vec{V}_{INV,i} - \vec{V}_{INV,i+1}}{I_i}.$$

where $\vec{V}_{INV,i}$ and $\vec{V}_{INV,i+1}$ are vector representations of the voltages measured by inverters $712_i$ and $712_{i+1}$ and the subtraction in the numerator of the above equation is a vector subtraction. Voltages $\vec{V}_{INV,i}$ and $\vec{V}_{INV,i+1}$ are not parallel vectors due to the voltage drop across $R_{INV,i}$, however, since this voltage drop will normally be small compared to the bus voltages, the value of $R_{INV,i}$ to a good approximation is given by the equation $$R_{INV,i} = (V_{INV,i} - V_{INV,i+1})/I_i$$

where $V_{INV,i}$ and $V_{INV,i+1}$ are the voltage magnitudes.

A non-zero phase angle can be usefully employed to increase the sensitivity of all connectivity resistance determination methods described previously. In the SSA method of FIG. 8 for example, all upstream active inverters $812_{i+1}$ to $812_N$ could supply current with a common non-zero phase angle to advantageously increase the voltage drop across $R_{BUS,i}$. If it is undesirable to supply reactive power to the grid, then half of the active inverters 812 could supply current of one phase angle and the remaining half of the active inverters 812 supply current of an equal but opposite phase angle to cancel the out of phase current component that would otherwise be seen by the AC grid. In this case, reactive power is effectively being circulated between power generating components connected to the local power bus, but reactive power is not injected into the AC grid.

Similarly, in the SAS method of FIG. 9A, active inverter $912_i$ can supply current with a non-zero phase angle to advantageously increase the voltage drops across $R_{INV,i}$ and $R_{BUS,i}$.

Two or modes could be used in sequence to provide multiple measurements of an inverter connection resistance and/or bus resistance that can be averaged or processed statistically to improve accuracy.

The invention claimed is:

1. A method for determining electrical connection resistances within an array of power generating components that are connected in parallel to a power bus, each power generating component in the array being controllable to operate in an active mode in which output current is supplied to the power bus by the power generating component and an inactive mode in which output current is not supplied to the power bus by the power generating component, the method comprising:

measuring, by one of the power generating components in the array that is in the active mode, an output current supplied to the power bus by said one of the power generating components;

measuring, by two power generating components in the array, a first voltage and a second voltage at respective outputs of the two power generating components; and determining a connection resistance within the array between first and second connection points which are coupled to the outputs of the two power generating components in the array and through which the output current flows, based on the measurements of the output current, the first voltage, and the second voltage.

2. The method of claim 1 wherein both measuring the output current and measuring the first voltage comprises controlling a single power generating component in the array to operate in the active mode and to measure the output current and the first voltage at its output, and wherein measuring the second voltage comprises controlling a second power generating component in the array that is coupled to the power bus adjacent to the single power generating component in the array to operate in the inactive mode and to measure the second voltage at its output.

3. The method of claim 2 wherein controlling a second power generating component comprises controlling a second power generating component in the array that is coupled to the power bus upstream from the single power generating component relative to a direction of power flow from the array to a load, and wherein determining a connection resistance comprises determining a connection resistance between the output of the single power generating component and the power bus.

4. The method of claim 3, further comprising:

measuring, by a third power generating component in the array that is in an inactive mode and is not outputting current to the power bus and is coupled to the power bus adjacent to and downstream from the single power generating component relative to the direction of power flow from the array to a load, a third voltage at an output of the third power generating component, wherein the determining a connection resistance further comprises determining a second connection resistance between the second connection point and a third connection point that is coupled to the output of the third power generating component in the array and through which the output current flows, based on the measurements of the output current, the second voltage, and the third voltage.

5. The method of claim 2 wherein controlling a second power generating component comprises controlling a second power generating component in the array that is coupled to the power bus downstream from the single power generating component relative to a direction of power flow from the array to a load, and wherein determining a connection resistance comprises determining a combination of a connection resistance between the output of the single power generating component and the power bus and a connection resistance between connection points at which the single power generating component and the second power generating component are connected to the power bus.

6. The method of claim 1, wherein measuring the first voltage comprises controlling a first power generating component in the array that is coupled to the power bus downstream from the one of the power generating components relative to a direction of power flow from the array to a load, to be in the inactive mode and to measure the first voltage at its output, wherein measuring the second voltage comprises controlling a second power generating component in the array that is coupled to the power bus downstream from the first power generating component relative to a direction of power flow from the array to a load, to be in the inactive mode and to measure the second voltage at its output, and wherein determining a connection resistance comprises determining a connection resistance between connection points at which the outputs of the first and second power generating components are connected to the power bus.

7. The method of claim 1, wherein measuring an output current comprises controlling each of said power generating components in the array to be in the active mode and to measure a respective output current supplied to the power bus by each of said power generating components in the array, wherein measuring a first voltage and a second voltage comprises further controlling each of said power generating components in the array to measure a respective voltage at a respective output of each of said power generating components in the array, wherein the determining a connection resistance comprises determining a respective connection resistance between adjacent connection points at which the outputs of said power generating components in the array are connected to the power bus.

8. The method of claim 1, wherein measuring an output current comprises measuring, by each of multiple power generating components in the array that are in the active mode, respective output currents supplied to the power bus by each of the multiple power generating components in the array, wherein measuring a first voltage and a second voltage comprises measuring, by pairs of power generating components in the array that are in the inactive mode, respective voltages at outputs of the power generating components of each pair,
wherein determining a connection resistance comprises determining respective connection resistances between adjacent connection points in the array at which outputs of said pairs of power generating components that are in the inactive mode are connected to the power bus.

9. The method of claim 1 wherein measuring the output current and measuring the first voltage and the second voltage comprise measuring by a DC to AC inverter of each of the power generating components in the array.

10. The method of claim 1 further comprising:
communicating said measurements to an array monitor for the determining said connection resistance.

11. The method of claim 2 further comprising:
communicating said measurements to an array monitor for the determining said connection resistance.

12. The method of claim 1, further comprising:
measuring the output voltage and measuring the first voltage and the second voltage sequentially at multiple locations in the array; and
determining connection resistances associated with multiple power generating components in the array.

13. The method of claim 12 wherein measuring the output voltage and measuring the first voltage and the second voltage are performed at regularly scheduled time intervals.

14. The method of claim 12, further comprising:
generating a fault signal responsive to any of said connection resistances exceeding a threshold value.

15. A power generation system comprising:
an array of a plurality of power generating components connected in parallel to a power bus, each power generating component in the array being controllable to operate in an active mode in which output current is supplied to the power bus by the power generating component and an inactive mode in which output current is not supplied to the power bus by the power generating component; and
an array monitor,
said power generating components in the array comprising a power generating component in the array that is in the active mode and measures an output current supplied to the power bus by said power generating component, and two power generating components in the array that measure a first voltage and a second voltage at respective outputs of the two power generating components,
said array monitor determining a connection resistance within the array between first and second connection points which are coupled to the outputs of the two power generating components in the array and through which the output current flows, based on the measurements of the output current, the first voltage, and the second voltage.

16. The power generation system of claim 15 wherein the power generating component in the array that is in the active mode measures the output current and the first voltage at its output, and wherein the power generating component that measures the second voltage is coupled to the power bus adjacent to the power generating component in the array that is in the active mode, and is controlled by the array monitor to be in the inactive mode.

17. The power generation system of claim 16 wherein the power generating component that measures the second voltage is upstream from the power generating component that is in the active mode relative to a direction of power flow from the array to a load, and wherein the connection resistance is a connection resistance between the output of the power generating component that is in the active mode and the power bus.

18. The power generation system of claim 17,
wherein said power generating components in the array further comprise a further power generating component in the array, that is controlled by the array monitor to be in the inactive mode and is coupled to the power bus adjacent to and downstream from the power generating component that is in the active mode, relative to the direction of power flow from the array to a load, and that measures a third voltage at an output of the further power generating component,
wherein said array monitor further determines a second connection resistance between the second connection point and a third connection point that is coupled to the output of the further power generating component in the array and through which the output current flows, based on the measurements of the output current, the second voltage, and the third voltage.

19. The power generation system of claim 16 wherein the power generating component that measures the second voltage is coupled to the power bus downstream from the power generating component that is in the active mode, relative to a direction of power flow from the array to a load, and wherein the connection resistance is a combination of a connection resistance between the output of the power generating component that is in the active mode and the power bus and a connection resistance between connection points at which the outputs of the two power generating components are connected to the power bus.

20. The power generation system of claim 15 wherein at least one of: the array monitor and one of the plurality of power generating components in the array generates a fault signal responsive to said connection resistance exceeding a threshold value.

21. The power generation system of claim 15, at least one of the first and second connection points being displaced from but at substantially the same voltage as one of the respective outputs of the two power generating components in the array.

22. The power generation system of claim 15, wherein said power generating components in the array comprise photovoltaic devices.

23. A method for determining electrical connection resistances within an array of power generating components that are connected in parallel to a power bus, each power generating component in the array being controllable to operate in an active mode in which output current is supplied to the power bus by the power generating component and an inactive mode in which output current is not supplied to the power bus by the power generating component, the method comprising:
controlling one of the power generating components in the array to be in the active mode and to measure an output current supplied to the power bus by said one of the power generating components;
controlling two power generating components in the array to measure a first voltage and a second voltage at respective outputs of the two power generating components; and
determining a connection resistance within the array between first and second connection points which are coupled to the outputs of the two power generating components in the array and through which the output current flows, based on the measurements of the output current, the first voltage, and the second voltage.

24. The method of claim 23 wherein said determining comprises:
receiving the output current, the first voltage, and the second voltage from the power generating component that measures the output current and from the two power generating components that measure the first voltage and the second voltage.

25. The method of claim 23,
wherein controlling one of the power generating components to be in the active mode and to measure the output current and controlling two power generating components to measure the first voltage and the second voltage comprises controlling a single power generating component in the array to be in the active mode and to measure both the output current and the first voltage at its output, and controlling a
second power generating component that is coupled to the power bus adjacent to the single power generating component in the array to measure the second voltage at its output,
the method further comprising:
controlling the second power generating component to be in the inactive mode while the second voltage is measured.

26. The method of claim 25, wherein the second power generating component is coupled to the power bus upstream from the single power generating component relative to a direction of power flow from the array to a load, and wherein the connection resistance is a connection resistance between the output of the single power generating component and the power bus.

27. The method of claim 26, further comprising:
controlling a third power generating component, that is coupled to the power bus in the array adjacent to and downstream from the single power generating component relative to the direction of power flow from the array to a load, to be in the inactive mode and to measure a third voltage at an output of the third power generating component,
wherein determining the connection resistance further comprises determining a second connection resistance between the second connection point and a third connection point that is coupled to the output of the third power generating component in the array and through which the output current flows, based on the measurements of the output current, the second voltage, and the third voltage.

28. The method of claim 25 wherein the second power generating component is coupled to the power bus downstream from the single power generating component relative to a direction of power flow from the array to a load, and wherein the connection resistance is a combination of a connection resistance between the output of the single power generating component and the power bus and a connection resistance between connection points at which the output of the single power generating component and the output of the second power generating component are connected to the power bus.

29. The method of claim 23,
wherein controlling one of the power generating components to be in the active mode and to measure an output current comprises controlling each of said power generating components in the array to be in the active mode and to measure a respective output current supplied to the power bus by each of said power generating components,
wherein controlling two power generating components to measure the first voltage and the second voltage comprises controlling pairs of said power generating components in the array to measure respective voltages at respective outputs of said power generating components of each pair,
wherein determining a connection resistance comprises determining respective connection resistances between pairs of adjacent connection points in the array at which outputs of said pairs of power generating components are connected to the power bus.

30. An apparatus comprising:
an interface that enables communication with power generating components in an array in which said power generating components are connected in parallel to a power bus, each power generating component in the array being controllable to operate in an active mode in which output current is supplied to the power bus by the power generating component and an inactive mode in which output current is not supplied to the power bus by the power generating component; and
a connectivity resistance monitor, operatively coupled to the interface, to control one of the power generating components in the array to be in the active mode and to measure an output current supplied to the power bus by said one of the power generating components; to control two power generating components in the array to measure a first voltage and a second voltage at respective outputs of the two power generating components; and to determine a connection resistance within the array between first and second connection points which are coupled to the outputs of the two power generating components in the array and through which the output current flows, based on the measurements of the output current, the first voltage, and the second voltage.

* * * * *